United States Patent [19]

Debe

[11] Patent Number: 5,139,592
[45] Date of Patent: Aug. 18, 1992

[54] LOW GRAVITY ENHANCED GROWTH OF PHTHALOCYANINE POLYMORPHS AND FILMS

[75] Inventor: Mark K. Debe, Stillwater, Minn.

[73] Assignee: Minnesota Mining and Manufacturing Company, St. Paul, Minn.

[21] Appl. No.: 570,623

[22] Filed: Aug. 20, 1990

Related U.S. Application Data

[60] Division of Ser. No. 327,898, Mar. 23, 1989, Pat. No. 5,071,691, which is a continuation-in-part of Ser. No. 218,817, Jul. 13, 1988, abandoned.

[51] Int. Cl.$^5$ .................... C30B 23/06; C30B 29/54
[52] U.S. Cl. ............................. 156/612; 156/600; 156/610; 156/DIG. 62; 156/DIG. 113
[58] Field of Search ....... 156/600, 610, 613, DIG. 62, 156/DIG. 113

[56] References Cited

U.S. PATENT DOCUMENTS

| | | | |
|---|---|---|---|
| 2,486,351 | 10/1949 | Wiswall, Jr. ............... | 260/314.5 |
| 2,770,629 | 11/1956 | Eastes ....................... | 260/314.5 |
| 3,051,721 | 8/1962 | Pfeiffer ...................... | 260/314.5 |
| 3,150,150 | 9/1964 | Brand ........................ | 260/314.5 |
| 3,160,635 | 12/1964 | Knudsen et al. ........... | 260/314.5 |
| 4,919,900 | 4/1990 | Martin et al. .............. | 156/DIG. 62 |
| 4,940,854 | 7/1990 | Debe ......................... | 428/411.1 |

FOREIGN PATENT DOCUMENTS 62-77455  4/1987  Japan ............................ 260/314.5

OTHER PUBLICATIONS

Debe, "Industrial Materials Processing Experiments Onboard the Space Shuttle Orbiter", J. Vac. Sci. Technol. A 4(3) Jun. 1986, pp. 273-279.

Carruthers, "Crystal Growth in a Low Gravity Environment", Journal of Crystal Growth, vol. 42 (1977), pp. 379-385.

Avduyevsky et al., "Technological Experiments Aboard Salyut-5", Acta Astronautica, vol. 7 (Jul. 1980), pp. 867-876.

Gorbi et al., "Growth of Organic Crystals in a Microgravity Enrivonment", Journal of Crystal Growth, vol. 76 (1986), pp. 673-680.

Buchan et al., "Mass Spectrometric Studies of Trimethylindium Pyrolysis", Journal of Crystal Growth, vol. 92 (1988), pp. 591-604.

M. K. Debe, J. Vac. Sci. Technol. A 5(4), Jul./Aug. 1987, pp. 2406-2411.

M. K. Debe, Interfacial Phenomena in the New and Emerging Technologies, Ed. W. B. Krantz, May 29-31, 1986, pp. 5-46 to 5-16.

M. K. Debe et al., Polymer Preprints 28 (2), Am. Chem. Soc., Aug. 1987, pp. 453-454.

Assignee's copending application Ser. No. 07/513,943.

L. van Den Berg and W. F. Schnepple, Materials Processing in the Reduced Gravity Environment of Space, ed. Guy E. Rondone, Elsevier, NY (1982) 439.

(List continued on next page.)

Primary Examiner—Robert Kunemund
Attorney, Agent, or Firm—Gary L. Griswold; Walter N. Kirn; Lorraine R. Sherman

[57] ABSTRACT

A polymorph of a phthalocyanine, designated M-phthalocyanine or M-metal phthalocyanine, has spectroscopic properties different from those of any of known crystalline polymorphs of phthalocyanine, the polymorph having been prepared in an environment of at most 0.1 G. In a further aspect, a process is disclosed for preparing novel organic films comprising a closed chamber physical vapor transport (PVT) in a low gravity environment.

Films of novel polymorphs have a surface roughness factor in the range of greater than 1.000000 and less than 1.0000010, a density of at least 50 percent increase over any polymorph of the same molecules produced in unit gravity, and in which at least 50 weight percent of the molecules of said film have a common uniaxial orientation.

8 Claims, 15 Drawing Sheets

OTHER PUBLICATIONS

H. Wiedemeier, F. C. Klaessig, E. A. Irene, S. J. Wey, *J. Cryst. Growth*, 31, 36 (1975).

H. Wiedemeier, H. Sadeek, F. C. Klaessig, M. Norek & R. Santandrea, *J. Electrochem. Soc.*, 124(7), 1095 (1977).

R. Langlais, J. C. Launay, M. Pouchard & P. J. Hagenmuller, *J. Crystal Growth*, 62, (1986) 145.

H. Wiedemeier, D. Chandra & F. C. Klaessig, *J. Crystal Growth*, 51 (1980) 345.

E. Kaldis, R. Cadoret & E. Schonherr, Chapter 11, *Fluid Sciences and Materials in Space*, ed. H. U. Walter, Springer-Verlay (1987).

B. I. Knudsen, *Acta Chem. Scand.* 20, 1344 (1966).

J. M. Assour, *J. Phys. Chem.*, 69(7), 2295 (1965).

J. Sharp & M. Abkowitz, *J. Phys. Chem.*, 77(4), 477 (1973).

S. Zurong et al., *Kexue Tongbao*, 31 (16), 1108 (1986).

Meshkova et al., *Opt. Spectrosc.* (USSR) 43 (2), 151 (1977).

H. Saijo et al., *J. Crystal Growth*, 40 (1977) 118–124.

M. Ashida et al., *J. of Crystal Growth*, 8 (1971) 45–56.

C. J. Brown, *J. Chem. Soc.* (A), (1968) 2488.

N. Uyeda, M. Ashida & E. Suito, *J. of Appl. Physics*, 36(4) 1453 (1965).

M. Ashida et al., *Bulletin of the Chemical Society of Japan*, 39(12) (1966) 2616–2624.

C. J. Brown, *J. Chem. Soc. (A), (1968) 2494.*

Kobayashi et al., *Acta Cryst.*, A37, 692 (1981).

M. K. Debe, *J. Appl. Phys.*, 55(9), 3354 (1984).

Erratum, *J. Appl. Phys.*, 62(4), 1546 (1987).

Y. Murata, J. R. Fryer & T. Baird, *J. of Microscopy*, 108 (3) (1976) 261–275.

LOW GRAVITY ENHANCED GROWTH OF PHTHALOCYANINE POLYMORPHS AND FILMS

This is a division of application Ser. No. 07/327,898, filed Mar. 23, 1989, now U.S. Pat. No. 5,017,691, which was a continuation-in-part of U.S. Ser. No. 07/218,817, filed Jul. 13, 1988, now abandoned.

FIELD OF THE INVENTION

This invention relates to crystalline polymorphs of metal-free and metal-containing phthalocyanines. In another aspect, this invention relates to a process for providing the novel polymorphs using a low gravity environment. In a further aspect, this invention relates to layered structures comprising a film of the novel crystalline polymorphs of the invention. Films of the invention are useful in optical and electronic applications.

BACKGROUND OF THE INVENTION

Materials processing in a low gravity environment has been made possible by the advent of a space shuttle orbiter. Prior to this event it was not possible to grow crystals or deposit thin films by vapor phase methods in a low gravity environment (1 meter/sec$^2$ or less residual gravitational acceleration). There does not appear to be any prior art dealing with closed chamber physical vapor transport growth of organic films even under unit gravity conditions.

Background art involving low gravity materials processing by vapor phase methods are the physical vapor transport experiments flown on the Space Shuttle Orbiter, and earlier Skylab and Appolo-Soyuz missions, in which bulk crystals of alpha-HgI$_2$ and GeSe were grown by physical vapor transport [see L. van Den Berg and W. F. Schnepple, in *Materials Processing in the Reduced Gravity Environment of Space*, ed. Guy E. Rindone, Elsevier, New York, (1982) 439; H. Wiedemeier, F. C. Klaessig, E. A. Irene, and S. J. Wey, J. Cryst. Growth 31, 36 (1975); H. Wiedemeier, H. Sadeek, F. C. Klaessig, M. Norek and R. Santandrea, J. Electrochem. Soc. 124(7), 1095 (1977); F. Langlais, J. C. Launay, M. Pouchard and P. J. Hagenmuller, J. Crystal Growth 62 (1986) 145; H. Wiedemeier, D. Chandra, and F. C. Klaessig, J. Crystal Growth 51 (1980) 345; and E. Kaldis, R. Cadoret and E. Schonherr, Chapter 11 in *Fluid Sciences and Materials Science in Space*, ed. H. U. Walter, Springer-Verlag (1987)].

Low gravity effects on the mass transport rate of the crystal growth system of Ge-Si-Br to form Ge-Si crystals were studied on "Salyut-6"- "Soyuz" missions [E. Kaldis, R. Cadoret and E. Schonherr, Chapter 11 in *Fluid Sciences and Materials Science in Space*, ed. H. U. Walter, Springer-Verlag (1987)]. In some cases, in these earth-grown versus space-grown crystal growth experiments, the space grown crystals appeared different or had improved crystal habits, structural morphology or electronic properties.

There appears to be no art wherein the results of closed chamber vapor transport deposition and detailed characterization of organic materials is discussed; nor is there art known which describes the results of carrying out vapor transport growth of thin films and detailed characterization thereof in a low gravity environment; nor is art known which describes a vapor transport method, open or closed, to obtain uniaxially oriented organic films.

Existence of eight distinguishable polymorphs of copper phthalocyanine (CuPc) is known in the art. (Two polymorphic forms have very similar lattice structures but slightly differing packing patterns of the molecules in the unit cell.) Most of the crystalline forms have been created as pigment particles, produced by wet chemical or "acid pasting" preparations. The first six pigment forms of CuPc, i.e., alpha, beta, gamma, R, delta-1 and epsilon, were described in U.S. Pat. Nos. 2,486,351, 2,770,629, 3,051,721, 3,150,150, and 3,160,635, and in all cases the X-ray diffraction powder spectra are used to differentiate them. IR spectra are also shown to be sensitive to the alpha, beta, gamma, and R forms (see U.S. Pat. No. 3,051,721) and directly used to define the five alpha, beta, gamma, delta-1, and epsilon types [see B. I. Knudsen, Acta Chem. Scand. 20, 1344 (1966)]. The gamma-form was later proposed by J. M. Assour, J. Phys. Chem. 69(7), 2295 (1965) to simply be highly crystallized large particles of the alpha-CuPc, but Knudsen (supra) in turn provided evidence that the preparation described in U.S. Pat. No. 2,770,629 would produce a distinct polymorph.

The seventh form, x-CuPc, was described by J. Sharp and M. Abkowitz, J. Phys. Chem. 77(4), 477 (1973) as the result of rapid sublimation of CuPc into a gaseous ambient at pressures of 1-30 Torr. Again the IR and X-ray spectra were used as evidence.

A recent Japanese Patent disclosure (T. Kawaguchi et al., Patent Kokai No. JP62-77455, Apr. 9, 1987) discusses a vapor deposition method of forming metal-phthalocyanine films to enhance their near infrared absorption characteristics. Their method consists of carrying out conventional sublimation, but in an inert gas atmosphere. Their procedure leads to maximum spectral absorption in the range 774 to 798 nm for 11 metal-phthalocyanines. Details in the translation were lacking, but this appears to be their version of the open chamber flowing gas sublimation technology developed at Xerox Corp. to produce the x-polymorph pigment particles of phthalocyanines by subliming them in an inert gas pressure of 1-30 Torr. An even clearer discussion of this same effect has been published by the Chinese [S. Zurong et al., Kexue Tongbao 31 (16), 1108 (1986)] and predates the Japanese patent work. In the Chinese reference, variation of X-ray diffraction spectra with chamber pressure is discussed as well as absorption spectra. An even earlier reference, [Meshkova et al., Opt. Spectrosc. (USSR) 43 (2), 151 (1977)]describes more briefly the same effect. An important fact is that in every one of these prior art cases, deposited CuPc material changed from alpha to x-CuPc as the ambient pressure increased. This is in sharp contrast to the instant invention films grown by closed chamber physical vapor transport (PVT) which show no x-CuPc.

The last distinct polymorph of CuPc disclosed is the delta-2, an orthorhombic form, grown by vapor deposition onto single crystalline graphite and characterized by selected area electron diffraction (SAD) and transmission electron microscopy (TEM) [see H. Saijo et al., J Crystal Growth 40 (1977) 118-124]

Alpha-CuPc is also called the meta-stable form since it can be thermally converted to the beta-CuPc form [see M. Ashida et al., J. of Crystal Growth 8 (1971) 45-56, designated M. Ishida I]. The latter can be obtained in adequate sized crystals such that a complete crystal structure has been found by C. J. Brown, J. Chem. Soc. (A), (1968) 2488, to be monoclinic P2$_1$/a with a=19.407 A (wherein A=Angstroms), b=4.790A, c=14.628A and beta=120.93 degrees.

Meta-stable alpha-CuPc has not been obtainable in single crystals large enough to do a full crystal structure determination but it is generally assumed that most of the metal substituted phthalocyanines (Pc's) are isomorphic. This is expressly demonstrated from electron diffraction data for PtPc, CuPc, and ZnPc vacuum sublimation deposited as thin films onto mica [N. Uyeda, M. Ashida and E. Suito, J of Appl. Physics 36(4) 1453 (1965)]. Isomorphism is also shown using high resolution transmission electron microscopy (TEM) techniques for the metastable forms of Pt, Cu, Co, Fe, Ni and $H_2Pc$'s, vacuum sublimation deposited onto muscovite [see M. Ashida, et al., Bulletin of the Chemical Society of Japan 39(12) (1966) 2616-2624 designated M. Ishida II]. In particular, the alpha-PtPc form is stable and its X-ray determined crystal structure, monoclinic C2/C, is used as the model for alpha-CuPc [see C. J. Brown, J. Chem. Soc. (A), 1968, 2494]. This space group was consistent with the TEM/SAD data of Ashida et al. II, supra who determined lattice parameters for the alpha-CuPc in thin film form as a=25.92 A, b=3.79 A (wherein A=Angstroms), c=23.92A and beta=90.4 degrees.

The situation may be more complicated than this since even Brown [see C. J. Brown, J. Chem. Soc. (A), 1968, 2494 (1968)] describes a second non-beta form of PtPc. Kobayashi et al. Acta Cryst. A37, 692 (1981) propose on the basis of minimum exposure TEM images that ZnPc has at least three meta-stable alpha-polymorphs, and Debe (see M. K. Debe, J. Appl. Phys. 55(9), 3354 (1984) and Erratum, J. Appl. Phys. 62(4), 1546 (1987) has shown that a second meta-stable thin film form of $H_2Pc$ exists. Finally, Murata et al. (Y. Murata, J. R. Fryer and T. Baird, J. of Microscopy, 108 (3) (1976) 261-275) have also used minimum exposure TEM imaging of individual CuPc molecules stacked in very thin films on KCl to suggest that isomorphism with alpha-PtPc was not being adhered to.

Hence when vacuum sublimation deposited onto substates near room temperature, the metastable alpha-CuPc form is generally obtained and those instances when other metastable forms are obtained may simply reflect the influence of the substrate on the growth of a film when the lattice energy is comparable to the interface energy between the film and substrate molecules. Indeed, the delta-2 CuPc reported by Saijo et al. (supra) is a manifestation of this.

The most commonly obtained crystal form of a vacuum sublimation deposited film of CuPc is the metastable alpha-CuPc for which the crystal structure and lattice constants are as above (Ashida et al., II). The X-ray diffraction spectrum from a randomly oriented sample of crystallites forming a film, or a powder sample, would appear as in FIG. 1. Implied interplanar spacings and relative peak intensities are quite consistent among the various references which show such X-ray spectra of alpha-CuPc (see U.S. Pat. Nos. 3,051,721 and 3,160,635, and Assour, supra, and Sharp et al., supra) and the interplanar spacings derived from electron diffraction of the CuPc thin films (see Ashida et al., III supra).

SUMMARY OF THE INVENTION

Briefly, the present invention provides a film of a phthalocyanine comprising at least 90 weight percent of a single polymorph, the film having been prepared in an environment of at most 0.1G, the film having a surface roughness factor in the range of greater than 1.000000 and less than 1.000010 and a density of at least 50 percent greater than any polymorph of the same molecules produced in unit gravity, and in which at least 50 weight percent of the molecules of the film have a common uniaxial orientation.

In another aspect, the present invention provides a polymorph of a metal-free or a metal-containing phthalocyanine, designated M-phthalocyanine or M-metal phthalocyanine, respectively, having spectroscopic properties different from those of any of the known polymorphs of the metal-free and metal-containing phthalocyanines, said polymorph having been prepared in an environment of at most 0.1 G. As used herein "phthalocyanine" means metal-free and metal-containing phthalocyanines and substituted derivatives thereof.

In still another aspect, the present invention provides a layered structure comprising a substrate and coated on at least one surface thereof a layer comprising a polymorph of a phthalocyanine, designated M-phthalocyanine or M-metal phthalocyanine, the polymorph having spectroscopic properties different from those of any of the known polymorphs of the phthalocyanine, the polymorph having been prepared in an environment of at most 0.1 G.

In a further aspect, a process is disclosed for preparing novel crystalline polymorphs of phthalocyanines comprising closed chamber physical vapor transport (PVT) in a low gravity environment.

The low gravity environment (i.e. 0.1 G or less), which is available in a space shuttle orbiter, has provided the means to carry out a low residual gravity materials process and obtain novel materials. Novel forms of materials have become available because of this unique combination of closed chamber physical vapor transport, and low residual gravitational acceleration, which eliminates buoyancy driven convection.

In a unit gravity environment, i.e. in an earth surface laboratory during a PVT process, solutal diffusion, thermal diffusion and bouyancy driven convection are the primary transport mechanisms of a sublimed source material to a substrate. In a reduced gravity environment, such as in low earth orbit (LEO) aboard a space shuttle orbiter, the buoyancy driven convection is minimized or eliminated totally. Carrying out a PVT deposition process in the absence of a net gravitational acceleration eliminates convection which allows the diffusion mechanisms to dominate. The present invention discloses that such processing gives enhanced film qualities.

Articles of this invention, prepared in a low gravity environment, have layers that are smoother, contain at least 50 weight percent, preferably at least 90 weight percent of novel crystalline forms of phthalocyanine compounds, contain none or lesser amounts of other polymorphs of phthalocyanine compounds as in mixtures, exhibit increased homogeneity in optical properties, and are more highly uniaxially oriented (20 percent more on average) and are substantially denser (at least 10 percent denser, preferably 50 percent denser, and more preferably 100 percent denser), than the corresponding layers prepared under unit gravity conditions.

In this application:

"earth gravity" or "unit gravity" means the magnitude of the earth's gravitational acceleration vector as measured at sea level and has the value of approximately 9.8 m/sec$^2$ and is represented by 1 G;

"low gravity" or "low earth gravity" means the magnitude of the resultant acceleration experienced by an object in, for example, low earth orbit, and is at most 1 m/sec$^2$ or 0.1 G, preferably in the range of $10^{-9}$ G to 0.1 G;

"low earth orbit (LEO)" means the trajectory of an earth orbiting satellite more than 50 miles above the earth's surface; typically, orbits are in the range of 50 to 250 miles above the earth's surface;

"gravitational acceleration vector, G" means the acceleration vector of a freely falling body falling directly down towards the center of the earth at the earth's surface;

"convection" means the flow of a fluid due to density differences and/or external forces;

"epitaxy" means the ordered growth of an overcoated material on the surface of a coated substrate, such that the crystalline properties and orientation of the overcoated material mimics the orientation and crystallinity of the coated substrate;

"physical vapor transport (PVT)" means a process whereby a material is sublimed under an ambient low pressure gas (e.g., 0.001 to 1000 Torr), allowed to advect (diffusion and convection) along a thermal gradient to a cooler surface and there recondenses on the growing thin film surface;

"film" and "layer" are used interchangeably and mean a continuous or discontinuous layer having a thickness in the range of 0.3 nm (3 Angstroms) to 10 micrometers (100,000 Anstroms);

"crystallites" means small single crystalline regions or domains of material which together comprise the layer and have a crystallite size of about 5 nm (50 Angstroms) or less and up to about 500 nm (5000 A);

"anisotropic" means having different properties in different directions;

"isotropic" means having the same properties in all directions;

"polymorph" means any of the crystalline forms of a material;

"homogeneity" means uniformly varying properties;

"smooth" means that the surface roughness factor (defined as the ratio of the true surface area to the geometric planar area and determined, for example, by direct phase contrast interferometry) is less than 1.000010, preferably in the range of 1.000000 to 1.000009;

"closed chamber PVT" means that the PVT process takes place within an evacuable, sealable chamber, also referred to as an ampoule, which is closed to the transport of all material in or out of the chamber during the processing; in closed chamber PVT the reaction ampoule within which the process occurs is sealed so that none of the buffer gases or sublimate vapor is lost or renewed during the process; the PVT described in this invention is a closed process;

"oriented seed film" means a thin inorganic or organic layer, between about 0.5 nanometers and 1000 nanometers thick, in which the molecules comprising the film are preferentially oriented, 50 weight percent at film are preferential least, in a common direction;

"substrate" means those materials which are suitable as supports for coated materials and which will maintain their integrity at the temperatures and vacuums imposed upon them during the formation of thin film organic coatings and overcoatings;

"coating" means that an organic material, usually as a thin layer, is put in intimate contact with (covers) all or at least a portion of at least one surface of a substrate;

"overcoating" means an organic material which is put in intimate contact with all or at least a portion of a coating. Where a coating is patterned and has gaps, the overcoating will cover at least a portion of at least one surface of a substrate;

"uniaxial" layer means that the layer material properties are anisotropic with respect to one direction in the material, but isotropic within the plane perpendicular (orthogonal) to the uniaxial direction;

"b-axis" means the crystallographic axis of the material crystal structure which is parallel to the stacking axis of the molecules, conventionally taken as the smallest of the a, b, c unit cell lattice vectors defining the crystalline lattice;

"standing b-axis" means that the b-axis is inclined at an angle equal to or less than approximately 30° with respect to the perpendicular direction to the substrate plane;

"substantially free" means containing at most 10 percent of the total quantity;

"parallel b-axis" means that the b-axis is parallel to the substrate plane;

"source material" or "source molecules" means any organic compound that can be vapor deposited; preferred examples are metal-free or metal-containing phthalocyanine;

"material" means an element or a compound;

"chamber" means an enclosed space bounded by inorganic or organic wall materials; and "denser" means more material mass per unit volume.

Articles of this invention are useful in the technology areas where optical, electronic and chemical properties of organic thin layers are a consequence of the film surface smoothness, uniformity, intrinsic microstructure and microstructure orientation relative to a substrate supporting the layer. These technologies include photoconductive imaging, photovoltaic and energy conversion and control devices, information storage media, chemical sensors and integrated optical processing systems for communications and detection.

The process of this invention is useful in the broad technology areas which utilize any processes such as physical vapor transport, chemical vapor transport, chemical vapor deposition, or metal-organic chemical vapor deposition. These include both organic and inorganic thin film, crystal growth and semiconductor processing by vapor transport methods where convective disturbances can be disadvantageous.

DETAILED DESCRIPTION OF THE INVENTION

Figure 1:
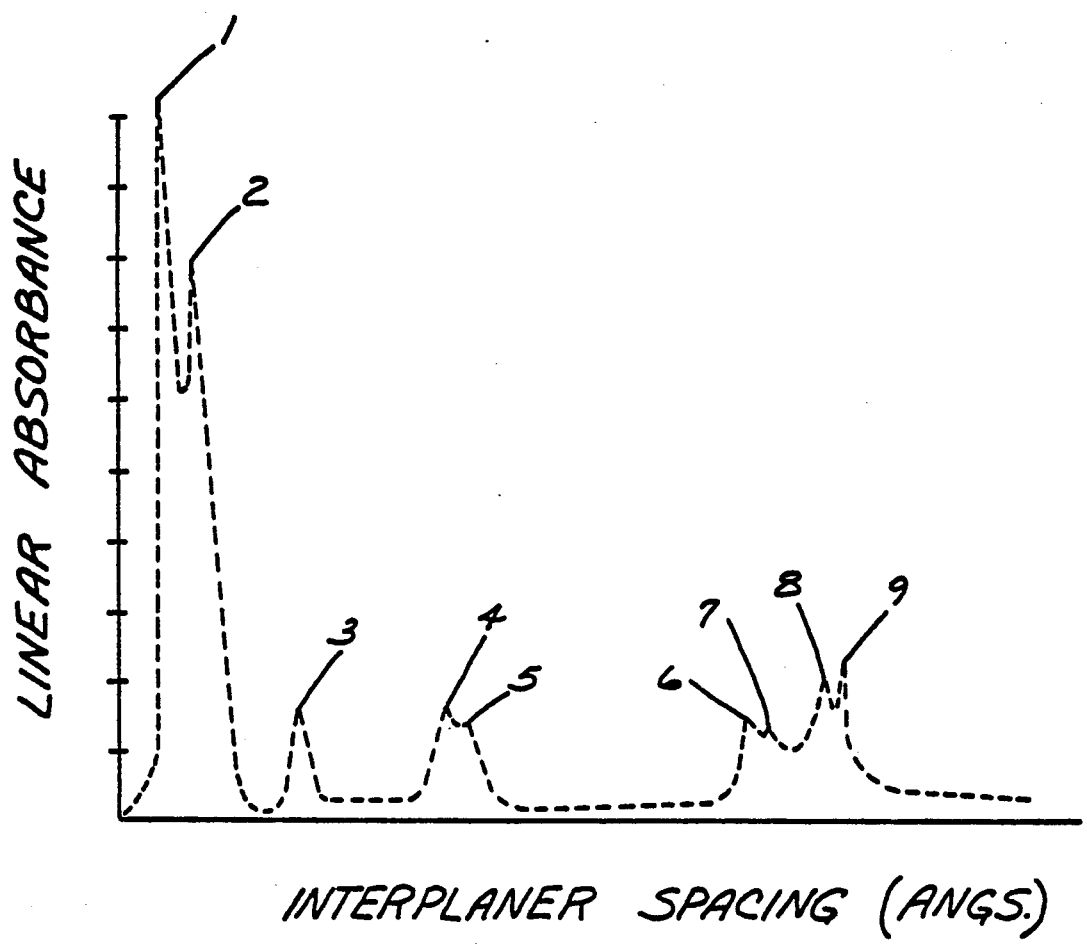
FIG. 1 shows a bulk powder X-ray diffraction curve for alpha-copper phthalocyanine (alpha-CuPc) (comparative) from U.S. Pat. No. 3,051,721.

The novel polymorphs of the invention are metal-free phthalocyanines and metal-containing phthalocyanines, designated M-phthalocyanines and M-metal phthalocyanines, having spectroscopic properties different from those of any of the known crystalline polymorphs of metal-free phthalocyanines and metal-containing phthalocyanines, the polymorphs having been prepared in an environment of at most 0.1 G. Respresentative examples of metal-containing phthalocyanines include those of transition and noble metals such as Cu, Pt, Pd, Fe, Nb, Zn, Sn, Ni, Mn, Co, Cr, Sb, Al, Pb, Ge, Ti, and V. The metal atom may complex with other elements such as halides, oxygen, sulfur, or selenium. The metal-containing and metal-free phthalocyanines include ring substituted phthalocyanines wherein the substituting group can be halo, nitro, or any aliphatic, cycloaliphatic, or aromatic group having up to 48 C atoms and up to 16 0, N, and S heteroatoms such as alkoxy, alkyl, alkaryl, aralkyl, alkylthio, aryl, arylthio, aryloxy, or alkenyl group, and the like. The preferred metal phthalocyanine is Cu phthalocyanine The formulae for metal-free phthalocyanine and copper phthalocyanine as are follows:

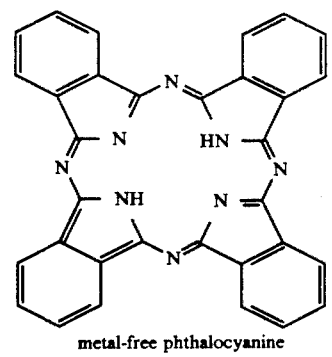

metal-free phthalocyanine

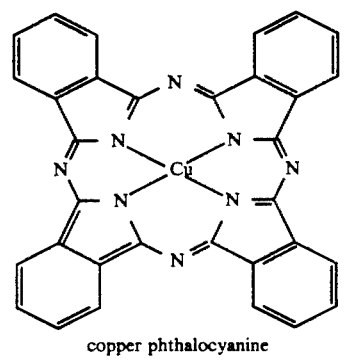

copper phthalocyanine

Derivatized phthalocyanines are disclosed in U.S. Pat. No. 4,031,109 and include the following: unsubstituted metal phthalocyanine, aluminum phthalocyanine, aluminum polychloro phthalocyanine, antimony phthalocyanine, barium phthalocyanine, beryllium phthalocyanine, cadmium hexadecachlorophthalocyanine, cadmium phthalocyanine, calcium phthalocyanine, cerium phthalocyanine, chromium phthalocyanine, cobalt phthalocyanine, cobalt chlorophthalocyanine, copper 4-aminophthalocyanine, copper bromochlorophthalocyanine, copper 4-chlorophthalocyanene, copper 4-nitrophthalocyanine, copper phthalocyanine, copper phthalocyanine sulfonate, copper polyphthalocyanine, deuteriomethalphthalocyanine, dysprosium phthalocyanine, erbium phthalocyanine, europium phthalocyanine, gadolinium phthalocyanine, gallium phthalocyanine, germanium phthalocyanine, hafnium phthalocyanine, halogen substituted metal-phthalocyanine, holmium phthalocyanine, indium phthalocyanine, iron phthalocyanine, iron polyhalophthalocyanine, lanthanum phthalocyanine, lead phthalocyanine, lead polychlorophthalocyanine, cobalt hexaphenylphthalocyanine, copper pentaphenylphthalocyanine, lithium phthalocyanine, lutecium phthalocyanine, magnesium phthalocyanine, manganese phthalocyanine, mercury phthalocyanine, molybdenum phthalocyanine, neodymium phthalocyanine, nickel phthalocyanine, nickel polyhalophthalocyanine, osmium phthalocyanine, palladium phthalocyanine, palladium chlorophthalocyanine, alkoxymetalphthalocyanine, alkylaminometalphthalocyanine, alkylmercaptophthalocyanine, aralkylaminometalphthalocyanine, aryloxylmetalphthalocyanine, arylmercaptophthalocyanine, copper phthalocyanine piperidine, cycloalkylaminometalphthalocyanine, diakylaminometalphthalocyanine, diaralkylaminometalphthalocyanine, dicycloalkylaminometalphthalocyanine, hexadecahydrometalphthalocyanine, imidomethylphthalocyanine, octaazametalphthalocyanine, tetraazametalphthalocyanine, tetra-4-acetylaminometalphthalocyanine, tetra-4-aminometalphthalocyanine, tetrachloromethylmetalphthalocyanine, tetradiazometalphthalocyanine, tetra-4-,4-dimethyloctaazametalphthalocyanine, tetra-4,5-diphenyloctaazametalphthalocyanine, tetra (6-methylbenzothiazoyl) metal phthalocyanine tetra-p-methylphenylaminometalphthalocyanine, tetramethylmetalphthalocyanine, tetranaphthotriazolylmetalphthalocyanine, tetra-4-naphthylmetalphthalocyanine, tetra-4-nitrometalphthalocyanine, tetra-4-nitrometalphthalocyanine, tetra-peri-naphthylene-4,5-octaazametalphthalocyanine, tetra-2,3-phenyleneoxide metalphthalocyanine, tetra-4-phenyloctaazametalphthalocyanine, tetraphenylmetalphthalocyanine, tetracarboxylic acid, tetraphenylmetalphthalocyanine tetrabarium carboxylate, tetraphenylmetalphthalocyanine tetra-calcium carboxylate, tetrapyridymetalphthalocyanine, tetra-4-thionaphtheneneoctaazaphthalocyanine, platinum phthalocyanine, potassium phthalocyanine, rhodium phthalocyanine, samarium phthalocyanine, silver phthalocyanine, silicone phthalocyanine, sodium phthalocyanine, sulfonated metalphthalocyanine, thorium phthalocyanine, thulium phthalocyanine, tin chlorophthalocyanine, tin phthalocyanine, titanium phthalocyanine, uranium phthalocyanine, vanadium phthalocyanine, ytterbium phthalocyanine, zinc chlorophthalocyanine, zinc phthalocyanine. Together with, or in lieu of, the above metal phthalocyanines any suitable mixture, dimer, trimer, oligomer, polymer, copolymer or mixtures of metal phthalocyanine may be used. The phthalocyanine may also be in any suitable crystal form.

Many of these phthalocyanines crystallize into polymorphs having a "herringbone" packing pattern. Generally, the simpler phthalocyanines sublime without decomposing and can therefore be processed by vapor transport methods. The sublimation temperatures and vapor pressures can vary depending upon the compound.

In one embodiment, the novel M-CuPc polymorph as a uniaxially oriented thin layer exhibits six distinct X-ray diffraction peaks corresponding to lattice spacings in the range of 0.32 to 0.38 nm+/−0.001 nm (3.2 to 3.8 A +/−0.01 A). This is in direct contrast to the known alpha-CuPc which exhibits only four diffraction peaks in this range, and beta-CuPc which exhibits three. None of the other known polymorphs of Cu phthalocyanine exhibit these same six peaks, in particular two peaks at 0.343 and 0.350 nm±0.001 nm are unique to the M-CuPc.

This novel polymorph exhibits in a thin film RAIR spectrum the distinguishing feature of a major infrared absorption peak at approximately 727 to 728 wave numbers ($cm^{-1}$) and the absence of a peak at 778 wave numbers. This is in direct contrast to alpha-CuPc which exhibits a main absorption peak at 720 to 722 wave numbers, and beta-CuPc which exhibits - main absorption peak at 730 wave numbers and a peak at 778 wave numbers. In addition, M-CuPc grown in a low gravity environment exhibits a higher uniaxial ordering than other polymorphs as indicated by RAIR spectra relative band intensities. All wave numbers are accurate to ±1 $cm^{-1}$.

The novel M-CuPc polymorph exhibits additional unique properties as a consequence of the absence of convection in low gravity environment, such as 1) smooth surface topography (i.e., a surface roughness factor greater than 1.000000 and less than 1.000010, preferably in the range of 1.000000 to 1.000009), 2) at least 90 weight percent, preferably 100 percent, pure polymorphic content, 3) higher uniaxially ordering, i.e., at least 90 percent, preferably 100 percent, uniaxially ordering, (crystallites are more uniformly aligned along the standing b-axis), and 4) enhanced absorption of light radiation at 800 nm compared to the alpha- and beta-polymorphs. In addition, the M-CuPc exhibits 5) more homogeneous optical properties (e.g. greater optical perfection to the naked eye), and 6) a substantially increased density, preferably at least 50 percent increased and more preferably at least 100 percent increased over any polymorph of the same molecule produced in unit gravity. Enhanced qualities of the low earth orbit grown CuPc thin films can be ascribed to the absence of a resultant gravitational acceleration vector and the accompanying reduced convection. It is anticipated that all M-phthalocyanines and M-metal phthalocyanines will exhibit similar desirable properties in a low gravity environment as a consequence of the absence of convection.

The process of the present invention provides novel organic films and utilizes closed chamber physical vapor transport (PVT) in a low gravity environment. The process is applicable to any organic source material which is capable of being vapor deposited.

PVT is a gaseous thermal process used to grow crystalline forms of materials which cannot readily be produced from solution or melt phases. In the past, PVT has been used predominantly for inorganic materials. PVT is similar to chemical vapor transport deposition in that the material of interest is delivered to the growth interface from a gaseous ambient (also called a buffer or carrier gas) by a combination of diffusion and convection. However, in PVT the sublimed material does not chemically interact with the carrier gases. PVT may be either open chamber or closed chamber. In closed chamber PVT the reaction ampoule within which the process occurs is sealed so that none of the buffer gases or sublimate vapor is lost or renewed during the process. The PVT described in this invention is a closed process.

The process of the present invention comprises the steps of:

(a) providing an evacuable, sealable chamber comprising two ends, the chamber having a means for vacuum outgassing the chamber, means for introducing a buffer gas, a means for providing a temperature gradient between the two ends of the chamber so as to provide a hotter first end and a cooler second end, the chamber further comprising organic source molecules secured near the first end and a substrate secured near the second end which substrate optionally is coated on at least a portion of at least one surface thereof with a seed layer of crystallographically uniaxially oriented inorganic or organic molecules, and outgassing said chamber to a pressure in the range of $10^{-6}$ to $10^{-10}$ Torr;

(b) optionally, introducing a buffer gas into the chamber at a pressure in the range of 0.001 to 10,000 Torr and sealing the chamber, (c) subjecting said chamber to a low gravity environment of at most 0.1 G, (d) applying heat to the chamber such that the first end is at a temperature which is sufficient to sublime the source molecules, while cooling the second end to a temperature in the range of 0.25 to 0.99 of the first end temperature in degrees Kelvin, the application of heat at said first end continuing for a time sufficient to deposit the source molecules as a layer of the desired thickness onto the substrate or coated substrate to provide a layered structure having coated thereon a layer of a polymorphic form of the source molecules.

Useful means for the invention process include:

(1) means for vacuum outgassing includes a mechanical vacuum pump, a cryo-pump, an ion pump, and a turbo molecular pump or combination thereof;

(2) means for providing a temperature gradient includes a concentric electric heater around the first end, and/or extracting heat from the cooler end as by a heat pipe or a thermoelectric cooler.

(3) means for introducing a buffer gas includes any means known in the art such as through a leak valve, diffusion through a porous membrane, etc.

(4) securing the substrate and source material can be by any means known in the art such as fastening by spot welding, brazing, etc.

The source material, for example, can be contained within a capsule, in a vessel, coated on a support, or physically restrained in a suitable manner within the ampoule.

The substrate temperature during the deposition of the seed layer may be any value necessary to obtain the desired seed layer orientation. Preferred substrate temperatures lie in the range of $-50°$ C. to $250°$ C. for vacuum sublimation deposited films, this being in the range of 0.31 to 0.35 times the boiling point temperature in degrees Kelvin for many organic materials.

Substrates that are useful in the practice of this invention can be selected from those materials which will maintain their integrity at the temperatures and vacuums imposed upon them during coating and overcoating operations. The substrate can be flexible or rigid, planar or non-planar, convex, concave, aspheric, or combinations thereof. Materials such as metals and alloys, ceramics (e.g., glass, metal oxides), or their combinations can be used as substrates. Organic materials including polymers able to withstand coating and overcoating vacuums and temperatures can also be used.

Representative examples of metals useful as substrates for this invention include aluminum, cobalt, copper, molybdenum, nickel, platinum, tantalum; other examples include metal alloys, and metal oxides. The varying nature of metals or metal oxides can bring about no observable differences in the final composite, i.e., both the pure metals and metal oxide serve as inert substrates. Metal substrates can be exposed to the atmosphere before coating operations without adverse affects. The substrate can have any suitable thickness and the thickness of any substrate can vary over its length and width.

The optional first seed layer can be deposited by means known in the art, such as any non vacuum vapor transport process, any vacuum process such as sublimation or vapor transport or sputter deposition, or absorption from solution such as dip coating, Langmuir-Blodgett coating, Meyer bar coating, doctor blade coating, etc. to provide a first layer on a substrate in a continuous or discontinuous coating. This first layer can be any organic or inorganic material which can be used to epitaxially influence the nucleation and growth of the PVT deposited second layer (i.e. the first layer can be a "seed" layer), or it can act as a functional component in the resulting article, or it can isolate or bind the second PVT deposited layer to the substrate. Thickness of the first layer can vary from a fraction of a monolayer to 1 micrometer or more.

In a preferred embodiment, in regard to the optional first coated layer on the substrate, the substrate can also be varied between that of a bare, freshly sputter deposited copper surface and that of a substrate bearing a coating of a highly uniaxially oriented, 1150 A thick seed layer of metal free phthalocyanine, $H_2Pc$. The induced epitaxial growth of a PVT-deposited CuPc layer onto the $H_2Pc$ seed layer is an element of the invention described in U.S.S.N. 07/219,004, filed the same date as this application.

The low gravity deposited layer, which according to the method of the present invention can be provided by any organic phthalocyanine compound (herein sometimes referred to as "source" material), can be coated as a layer on the substrate or, optionally, on a previously coated substrate, in a low gravity environment. The source material is sufficiently pure so that outgassing is minimal in relation to the buffer gas pressure. The source material layer can be coated by any vapor transport process known such as physical vapor transport, chemical vapor transport, chemical vapor deposition, or metal-organic chemical vapor deposition. The preferred process is a physical vapor transport process, more preferably it is a closed chamber PVT process.

PVT is similar to chemical vapor transport deposition in that the material of interest is delivered to the growth interface from a gaseous ambient (also called a buffer or carrier gas) by a combination of diffusion and convection. However, in PVT the sublimed material does not chemically interact with the carrier gases. PVT may be either open chamber or closed chamber. In closed chamber PVT the reaction ampoule within which the process occurs is sealed so that none of the buffer gases or sublimate vapor is lost or renewed during the process. The PVT described in this invention is a closed process.

There are a number of cell operating parameters which can affect the PVT thin layer growth process. These include: a) composition and pressure of the buffer gas contained within the ampoule, b) pressure and composition of any residual gases contained within a provided outer stainless steel cell, but exterior to the ampoule, c) purity of the source material, d) maximum temperature of the substrate during processing, e) state of the substrate surface, i.e., whether the substrate is coated with a seed film or not, f) duration of the heating cycle and the temperature at the hotter end, g) ampoule wall temperature profile near the substrate determined by elements within the heater assembly, and h) resultant value of gravitational acceleration or the orientation of the chamber during processing in unit gravity.

In a closed PVT process, the PVT can be carried out in an ampoule of any desired shape, preferably having an aspect ratio in the range of 1 to 50. The preferred ampoule for the present invention process is a cylindrical pyrex ampoule, about 2.0 cm in diameter and 10 cm long. The ampoule contains the organic source material in one end (the hot end), an inert buffer gas at a pressure of several Torr, and a flat substrate in its other end. In a preferred embodiment, the substrate has a diameter of 1.4 cm, lies concentrically within the ampoule with its plane perpendicular to the ampoule axis, facing the source end. The ampoule is concentric within a cylindrical, wire wound resistance heater such that the temperature varies along the ampoule axis from about 400° C. at the hot end, to a temperature of about 70° C. at the substrate. This strong thermal gradient is the driving force for the transport of sublimed material from the source end of the ampoule to the substrate where the sublimed material forms a thin layer. The heater assembly is in turn contained concentrically within a stainless steel cell, about 7.6 cm (3 inches) in diameter and 22.9 cm (9 inches) long, which provides "vacuum" insulation to the heater and ampoule. This apparatus is disclosed in U.S. Pat. No. 4,620,963.

The buffer gas (carrier gas) can be any gas nonreactive with the source compound, the substrate, the optionally first coated layer, and the ampoule interior contents. Preferred buffer gases are inert gases such as the noble gases, nitrogen, fluorocarbons, and combinations thereof. Other common gases such as CO, $CO_2$, $H_2$, and higher molecular weight gaseous compounds, if unreactive with the source material, can be used. The lower limit of the buffer gas pressures can be usefully determined by the condition that the mean free path be significantly smaller (by at least a factor of 10) than the diameter of the ampoule. The upper limit of the buffer gas pressure is that beyond which adequate sublimation of the source material is prevented. Preferred pressures in the ampoule are in the range of 0.001 Torr to 1000 Torr or more. It is also envisioned within the scope of the invention to eliminate the buffer gas in cases where the vapor pressure of the source material is sufficiently high.

In a preferred embodiment, in the PVT process of the present invention, composition and pressure of the buffer gases were measured and found to be acceptably uniform among the experimental samples. For example, the nitrogen equivalent total ampoule pressures after processing were found to be $6\pm2$ Torr in all the ampoules considered. Furthermore, ampoule gas compositions were found to be similar within flight and ground ampoules (comparative), consisting of primarily hydrogen and carbon dioxide at levels of about .2 Torr, nitrogen, carbon monoxide and either helium or xenon at about the 0.5-1 Torr level, and trace amounts of methane, oxygen, water and argon.

There is a temperature gradient along the axis of the ampoule, there being a hot and a cooler end in the ampoule. Temperatures in the hot end of the ampoule in the PVT process of the present invention can be any temperature which 1) gives an adequate vapor pressure, and 2) does not cause the organic material (source material) to unduly decompose or react with the buffer gas. Preferred temperatures at the hot end are in the range of 50° C. to 600° C. The cooler end of the ampoule containing the substrate may be any temperature which is less than the temperature of the hot end, preferably less than 99 percent, but more than 25 percent, of the hot end expressed in degrees Kelvin.

Thickness of the second deposited layer can vary depending upon buffer gas pressure, vapor pressure of the source material, hot end temperature, substrate temperature, duration of the process, and orientation of the ampoule with respect to the earth's gravitational vector. Preferred thicknesses of the second deposited PVT layer are in the range of 0.3 nm to 1 micrometer.

The process may proceed for a period of minutes to many hours, preferably in the range of 1 to 12 hours.

Low gravity environment for the PVT process of the invention is provided by carrying out the process in an earth orbiting satellite such as a space shuttle orbiter or a space station or laboratory or a non human-tended, free orbiting platform. The time to achieve the low gravity environment is the time required for the satellite to reach a stable earth orbit (50 miles to 25,000 miles above the earth's surface).

The process of the present invention can be used with source materials which can be solids at room temperature and pressure and include aromatic compounds, aliphatic compounds, heterocyclic compounds wherein the heteroatoms can be any nonmetallic atoms, metal complexes of organic compounds, or any organic materials which are sublimable under the conditions of the process.

This invention provides novel polymorphs and layered structures comprising these polymorphs which find utility in technology areas where the optical, electronic, and chemical properties of organic thin layers are a consequence of their intrinsic microstructure and their orientation relative to a substrate supporting the layer. These include technologies such as photoconductive imaging, photovoltaic and energy conversion and control devices, information storage media, chemical sensors and integrated optical processing systems for communications and detection.

The examples below discuss the effect of low gravity processing on the microstructure properties of sample organic layers obtained in two space flight samples. These samples are compared with at least seven unit gravity grown comparative sample layers. It is very important therefor that the various experimental parameters a)-g) above be as controlled or documented as possible so that the differences can be ascribed to just the difference in the value of the resultant gravitational acceleration vector.

Composition and pressure of the buffer gases were measured and found to be acceptably uniform among the experimental samples. For example, the nitrogen equivalent total ampoule pressures after processing were found to be $6\pm2$ Torr in all ampoules considered. Furthermore, ampoule gas compositions were found to be similar within flight and ground control ampoules, consisting of primarily hydrogen and carbon dioxide at levels of about 2 Torr, nitrogen, carbon monoxide and either helium or xenon at about the 0.5-1 Torr level, and trace amounts of methane, oxygen, water and argon.

In regard to the substrates used, they also varied between that of a bare, freshly sputter deposited copper surface and that of a highly uniaxially oriented, 115 nm (1150 A) thick seed film of metal free phthalocyanine, $H_2Pc$. The latter seed film was vapor deposited onto freshly sputter deposited copper with the substrate held at 5° C.+5° C. sufficient to give alpha $H_2Pc$ in the standing b-axis orientation, as described in M. K. Debe, J. Appl. Phys. 55(9), 3354 (1984) and Erratum J. Appl Phys. 62(4), 1546 (1987).

In regard to substrate temperatures, they have been experimentally found to vary with the cell orientation in unit G processing and the ampoule and cell gas pressures and compositions, a direct consequence of convection enhanced heat transfer. Depending on the values of these parameters, the various ground control experiments had maximum substrate temperatures varying from 53° C. to 93° C. Both low gravity grown organic layers experienced maximum substrate temperatures of 68° C., intermediate to this range.

Purity of source materials is assumed since all source material was made and purified by identical procedures in two lots and no systematic spectroscopic evidence has been obtained to indicate that one lot is significantly different from the other.

Heat and temperature profiles during the experiments were automatically controlled for all ground and flight experiments. Each cell was processed at a hot end temperature of 4000° C., maintained for 4.00 hours.

For ground control experiments, they were done in both "hot-end-up" and hot-end-down" configurations.

Evidence for the enhanced thin film properties obtained by carrying out the PVT processing in a low gravity environment results from application of various optical spectroscopic and imaging techniques to the CuPc thin films. Comparison of ground based (GB)-grown and LEO-grown film characteristics permits concluding how the low gravity environment has improved film qualities.

Characterizational techniques used to analyze the CuPc films and which provide the basis for this invention are all appropriate to thin films overlaying a reflective metal substrate. These techniques and a brief description are:

a) grazing angle x-ray diffraction
b) external reflection-absorption infrared spectroscopy
c) direct phase contrast interferometric microscopy
d) spatially resolved ellipsometry
e) visible reflection-absorption spectroscopy
f) visual inspection with the unaided eye
g) scanning electron microscopy Grazing angle X-ray diffraction. This technique refers to the conventional theta-two theta X-ray diffraction scans used to characterize thin films of all types. As the incidence angle, theta, was varied, the detector was moved through a scattering angle of two theta such that the momemtum transfer vector of the X-ray scattering process was exactly normal to the film plane. Thus, the interplanar spacings along the direction perpendicular to the layer plane are scanned through, simultaneously while theta was scanned. In addition to lattice plane spacings, information on crystalline polymorph types and unit cell orientations relative to the substrate was obtained from these X-ray diffraction curves.

External reflection-absorption infrared spectroscopy. This technique uses infrared absorption spectroscopy, but was applied to the layers at a near grazing angle of incidence. The result was enhanced sensitivity and a polarization sensitivity to the mean orientation of the molecules in the layer relative to the substrate. Information was contained in the relative intensities of the IR absorption bands having different symmetries which can be used to obtain a numerical estimate of the degree of uniaxial ordering in the layers. The average spectral absorption of all the bands was used to estimate average layer thicknesses. Precise peak positions of certain absorption bands were sensitive to the type of crystalline polymorphs present, and hence was used to corroborate the X-ray diffraction conclusions.

Direct phase contrast interferometric microscopy. This technique gives a direct three dimensional computer graphics generated image of the CuPc film surface morphology. Spatial resolution parallel to the layer plane was close to 1 micrometer. Resolution in the direction perpendicular to the film was close to 10 Angstroms. It was possible to directly assess surface smoothness within a $196 \times 125$ square micrometer area of the PVT deposited films by visual inspection of the plotted micrographs and a statistical analysis of the plotted surface contours.

Spatially resolved ellipsometry. This refers to standard single angle of incidence, single wavelength ellipsometry, but carried out with the 1 mm diameter HeNe laser beam scanned stepwise across the 1.4 cm diameter of the film sample by translating the substrate in 0.5 or 1.0 mm increments. Ellipsometry is an optical technique for characterizing surfaces and thin layers in terms of two parameters, delta ($\Delta$) and psi ($\psi$). An elementary description of ellipsometry is that it measures the relative change in polarization state of light that is reflected from a surface. This is equivalent to measuring the relative amplitude and relative phase changes of the p and s- polarization components of the light. Specifically, the ellipsometric parameter $\psi$ is a measure of the amplitude change while $\Delta$ is a measure of the change in phase of the p and s- polarization components.

At each position, ellipsometric parameters, DEL ($\Delta$) and PSI ($\psi$), were obtained and hence an "ellipsometric profile" across the sample layer diameter was obtained. DEL and PSI parameters were sensitive to layer thicknesses and the refractive indices of $H_2Pc$ seed layer and CuPc PVT layers comprising the sample. Direct interpretation is not a simple process, but requires complex modelling of the optical response. However, since DEL is a direct measure of the relative phase change that occurs upon reflection by the s- and p-polarized light components, and PSI a direct measure of the relative amplitude change that occurs upon reflection, variation of these measured quantities with position directly reflects the degree of homogeneity in the deposited "optical thickness" of the CuPc layers.

Visible reflection absorption spectroscopy. This probe uses standard uv-visible absorption spectroscopy from 200 to 850 nm applied in a reflection mode at an incidence angle of about 68 degrees. Corroborating evidence of a different polymorph was obtained. The known polymorphic forms of CuPc are discussed above.

Scanning electron microscopy. This technique is well known in the art of material science for obtaining high spatial resolution electronic images of surfaces and film edges at magnifications up to and exceeding 30,000 times, revealing details of the physical microstructure of the surface or film.

Objects and advantages of this invention are further illustrated by the following examples, but the particular materials and amounts thereof recited in these examples, as well as other conditions and details, should not be construed to unduly limit this invention.

EXAMPLE 1

In this example low angle X-ray diffraction results were compared from LEO grown films and comparative unit gravity grown or GB (ground based) grown films. All films were grown by closed chamber PVT using the apparatus described in U.S. Pat. No. 4,620,963. The chamber was enclosed within a sealable stainless steel cell, which was evacuated or partially filled with a gas. Two basic types of GB samples were compared, viz. those obtained with the cell continuously evacuated during heating and those obtained with the cell backfilled with hydrogen to about the same level as occurred by out-gassing within the space flight cells. These latter ground experiments (comparative) most closely duplicated the flight experiment conditions except for the value of resultant gravitational acceleration. In addition, GB samples were obtained in each case with the "hot-end up" and "hot-end down" orientations and with or without a H₂Pc seed film. Also, both LEO and GB samples were obtained with the buffer gas containing intentionally added helium or xenon. Variation of these parameters accounted for the two types of LEO samples and eight types of GB samples which were compared. It was seen that despite the variation of these parameters, GB samples were very similar and LEO samples were very similar, but GB and LEO samples were distinct from one another. LEO samples are hereafter referred to as LEO 1 and 2 and GB samples as GB 1 through 8.

FIG. 1 shows the X-ray diffraction scan from a bulk sample of powdered alpha-CuPc. The diffraction peaks identify interplanar spacings of the polymorphic crystal structure, viz. 1 (13.0A), 2 (12.1A), 3 (8.85A), 4 (5.70A), 5 (5.49A), 6 (3.72A), 7 (3.57A), 8 (3.35A), 9 (3.24A).

Figure 2:
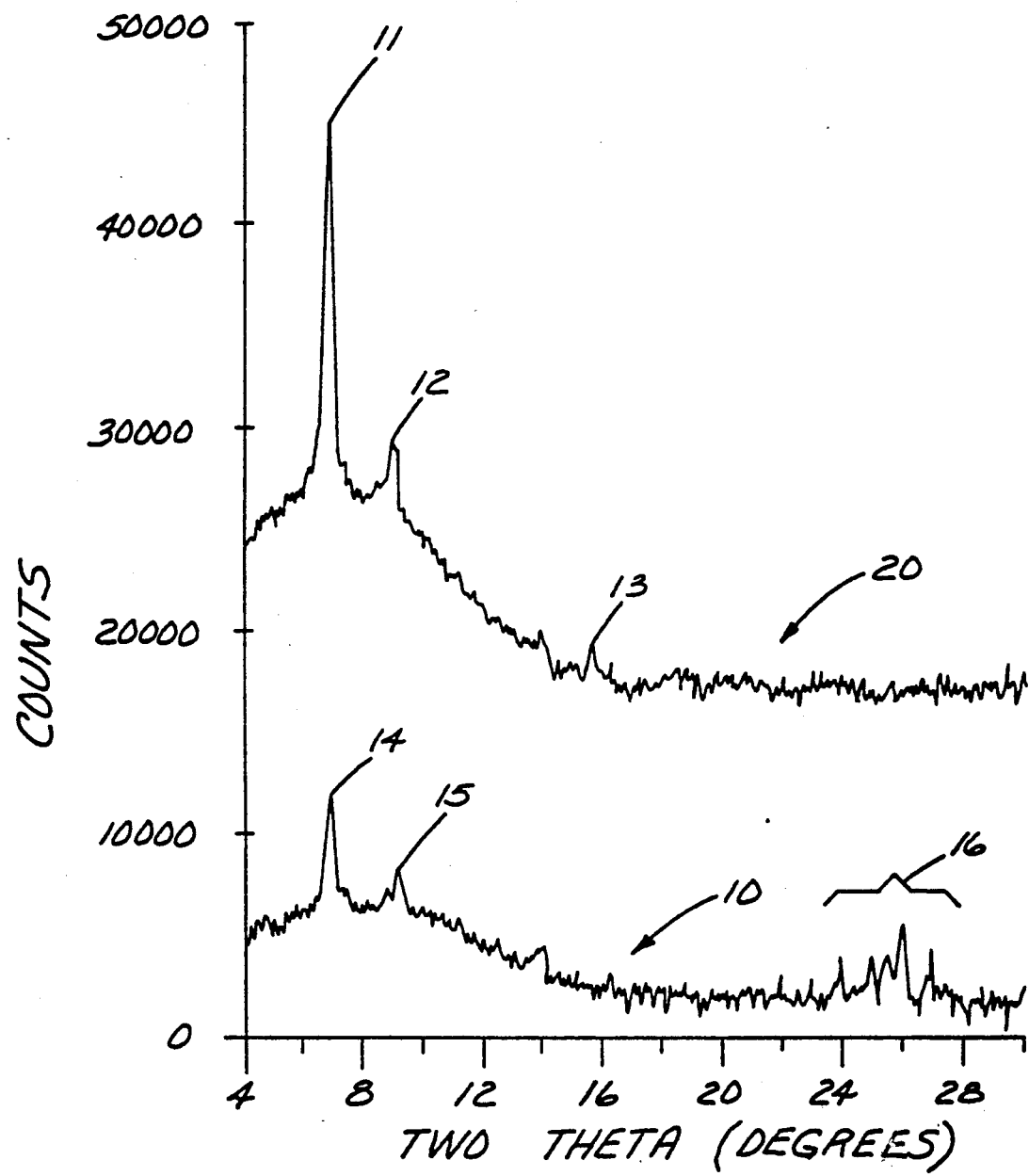
FIG. 2 shows low angle X-ray diffraction curves from two ground grown (comparative) PVT layers showing dominant beta-CuPc polymorphic components.

FIG. 2 shows the X-ray diffraction scans 10, 20 from two of these comparative experiments, GB 1 and 2, respectively, in which the orientation of the chamber during processing was varied between "hot-end up" (GB 1) and "down" (GB 2), and the substrate contained an H₂Pc seed film. Two other comparative samples, GB 3 and GB 4 were similar but had bare substrates. For samples containing the seed film, any contribution from the latter has been subtracted from the diffraction scans to show only the diffraction due to the CuPc overlayer. From known lattice spacings of beta-CuPc, the peaks can be identified with the lattice planes as follows: Peaks 11 and 14 (001) planes of beta CuPc, 12 and 15 (i.e., 20-1)- planes of beta CuPc, 13 (300) planes of beta CuPc, 16 planes of the new M-CuPc polymorph. In all four samples the crystalline components of the PVT grown films is clearly beta-CuPc which is highly oriented such that the b-axis of the crystal lattice is parallel to the film plane. This orientation is apparent not only from the peak indexing shown, but also because essentially no diffraction intensity is indicated for lattice spacings below 5.6 Angstroms (i.e., two theta values greater than approximately 16°). Only in sample GB 1 are there peaks 16 in the 3.2-3.7 Angstrom range. Several of these peaks can be identified with alpha-CuPc, as is discussed below.

Figure 3:
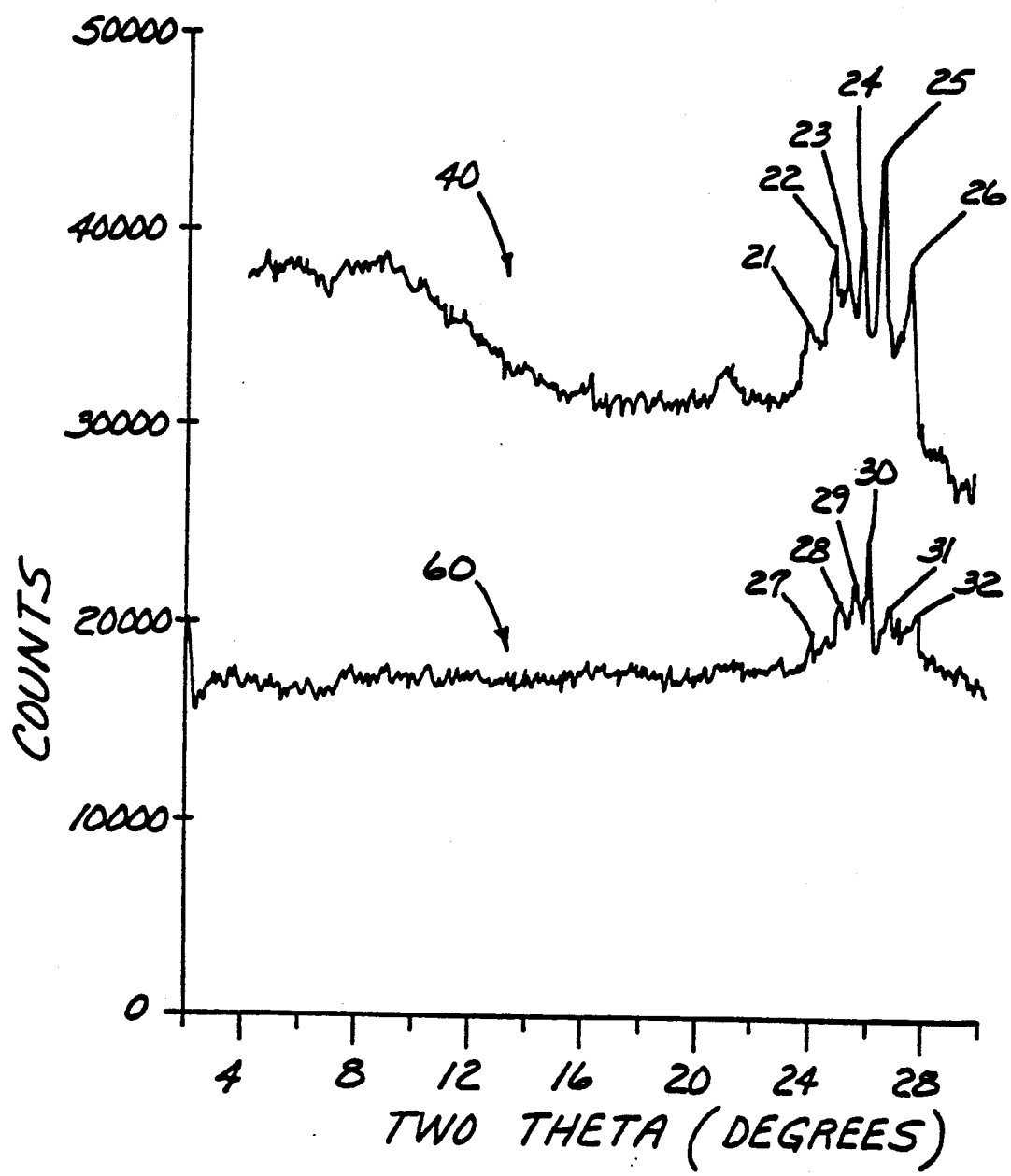
FIG. 3 shows low angle X-ray diffraction curves from two low gravity grown PVT layers showing the unique M-CuPc polymorph.

FIG. 3 shows the X-ray diffraction scans 60,40 from LEO samples of CuPc. These curves are distinctly different from those of FIG. 2. In contrast, now no significant peak intensities corresponding to lattice spacings greater than about 4.2 Angstroms are apparent (i.e., two theta values less than about 21°). Hence, whatever the crystalline polymorph type, the unit cell b-axis is not parallel to the film plane as in the unit gravity films, but "standing" effectively perpendicular to the film plane. Furthermore there are six distinct peaks 21, 22, 23, 24, 25, 26 and 27, 28, 29, 30, 31, 32 for which the two-theta positions correspond to the d-spacings between 3.22 and 3.75 Angstroms of: 21 (3.71), 22 (3.57), 23 (3.50), 24 (3.43), 25 (3.34) and 26 (3.22) for LEO 1, and 27 (3.7), 28 (3.56), 29 (3.49), 30 (3.43), 31 (3.34) and 32 (3.22). FIG. 1 showed that alpha-CuPc has only four peaks in this range. Comparing FIG. 3 with FIG. 1, it appears possible to correlate the four peaks in the LEO curves at 3.22, 3.34, 3.57 and 3.71 Angstroms with the conventional alpha-CuPc. However, the two peaks at 3.50 or 3.49 and 3.43 Angstroms appear to be unassignable to the conventional alpha-CuPc since they have not been previously reported in the prior art to our knowledge.

X-ray diffraction spectra from the thinner CuPc films of the other GB samples, those produced by evacuating the cells during heating, show few diffraction peaks. However, what diffraction peaks can be observed can be identified as due to the conventional alpha and beta polymorphs of CuPc, consistent with the results in FIG. 2 from the thicker GB films. The only exception are two small (or a single broad) peaks close to 3.49 and 3.44 Angstroms in the X-ray diffraction curve from GB 7 (not shown).

Several possibilities exist to explain the new peaks. First, the diffraction is from a new crystalline polymorph (call it M-CuPc), e.g., a metastable form distinct from either the conventional alpha, gamma, or beta forms discussed in the prior art as deriving from vacuum sublimation deposition. Second, the new peaks at 3.50 and 3.43 Angstroms are due to alpha- or beta-CuPc crystallites but crystallites uniquely and highly oriented such that just certain specialized lattice planes are exactly oriented parallel to the film plane. Considering all the possible lattice spacings for each of the alpha and beta forms which could simultaneously produce the 3.50 and 3.43 Angstrom peaks leads only to very unlikely candidates with structure factors that are too weak or orientations that are inconsistent. Third, other kndwn polymorphs, e.g., the highly stable x-CuPc or the substrate induced delta-CuPc also can be discounted by consideration of their powder diffraction patterns.

In view of these arguments, it seems that attributing the new diffraction peak structure to a new polymorph is the least unlikely possiblity, given the multiplicity of polymorphs already documented for CuPc, and the discussion in Saijo et al. (supra) on the epitaxially generated delta-2-CuPc. This new, M-CuPc form may be a consequence of both the PVT process and the influence of epitaxial growth on the ordered H₂Pc seed film.

It might also be concluded that this new highly oriented polymorph is a consequence only of processing in LEO. However, evaluation of sample GB 1 in FIG. 2 (and possibly GB 7) shows that apparently the same polymorph can occur along with beta-CuPc in unit gravity under convection-minimizing conditions, i.e., "hot-end up" with a seed film present although it can be shown that some convection is still present.

In conclusion, one advantage of carrying out the PVT in a low gravity environment where all buoyancy driven convection was eliminated is that low gravity yields films which uniquely contain just the new polymorph. The X-ray diffraction results from this example further showed that the LEO sample films comprised of the new M-CuPc polymorph were also highly uniaxially oriented (at least 90 percent were so oriented) in the standing b-axis orientation. These conclusions were further supported by the RAIR data discussed below compared with the ground based samples whose b-axes were oriented principally parallel to the film plane.

EXAMPLE 2

Figure 4A:
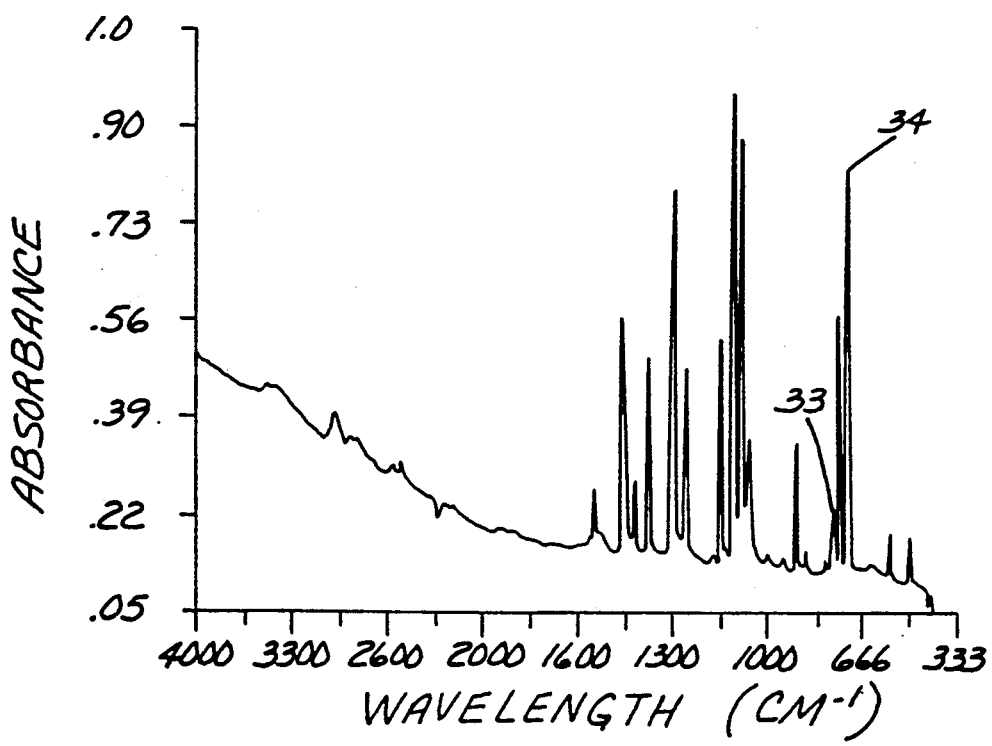
FIG. 4A shows an infrared transmission spectrum (comparative, powder alpha-CuPc)

FIG. 4A shows a bulk transmission infrared spectrum from alpha-CuPc powder, and 4B the RAIR spectrum from the LEO PVT grown sample #1. The bulk alpha-CuPc powder was obtained from vacuum vapor deposited CuPc. The thin film RAIR spectrum is from the top PVT deposited layer only, the metal free Pc underlayer's spectrum having been subtracted. The two important considerations of the spectra in FIGS. 4A and 4B, re the relative intensities of the various peaks of different vibrational mode symmetry and the peak frequency positions. The powder spectrum's peak intensities represent a random mixture of CuPc molecules and thus show the peak intensities without any orientation bias.

Figure 4B:
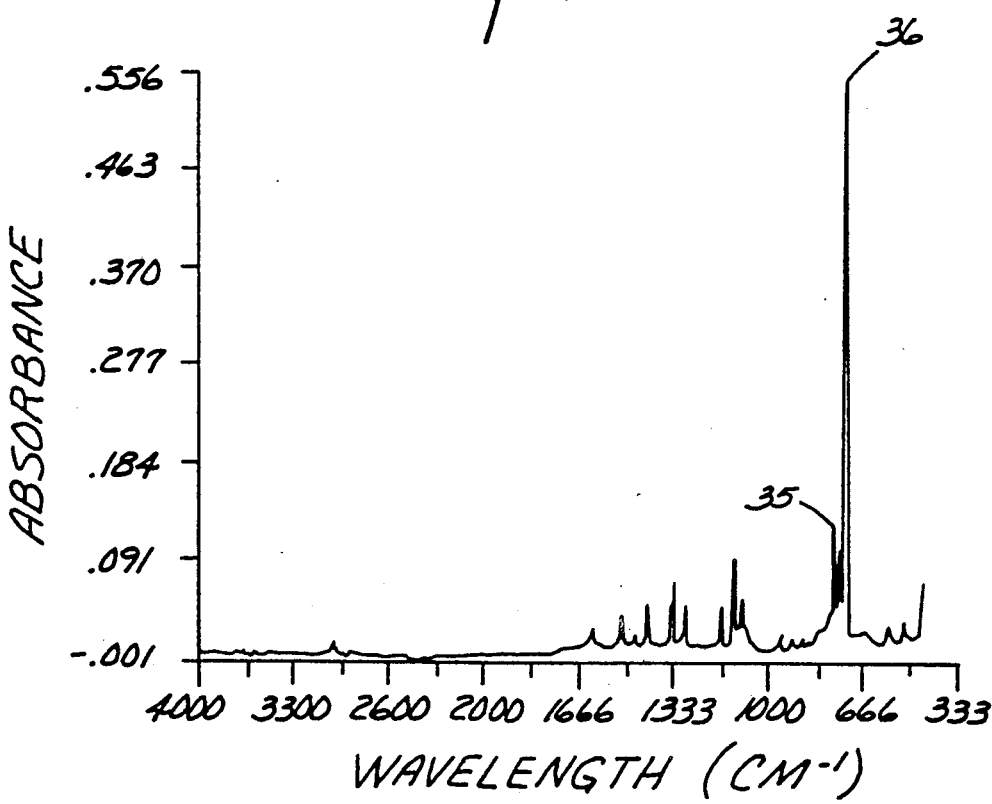
FIG. 4B shows the reflection absorption infrared spectrum (RAIR) of a low gravity PVT grown layer of CuPc.

The strong dissimilarity between the relative band intensities of the LEO spectrum in FIG. 4B clearly shows the CuPc molecules are highly preferentially oriented with respect to the substrate plane. A vibrational band assignment shows that 33, 35 (the 770 cm$^{-1}$ band) and 34, 36 (the bands in the 722−729 cm$^{-1}$ range) respectively are due to out-of-plane vibrational modes. These bands show a significant relative increase in intensity. Nearly all the other bands are due to in-plane modes and have transition moments along either of the two planar symmetry directions of the CuPc molecule. These in-plane bands show a significant relative decrease in intensity in FIG. 4B. Compared to the randomly oriented bulk reference spectrum, the LEO film's spectrum implies it is highly uniaxially ordered such that the CuPc molecules are preferentially oriented with their planes nearly parallel to the plane of the film. The PVT sample LEO 2 RAIR spectrum shows essentially the same relative intensities.

All PVT unit gravity grown control films of this example show a similar preferential orientation, but generally to a lesser degree. This degree of ordering can be estimated from the relative peak intensities of the two main band symmetry types using methods described by Debe, supra. The result is an order parameter, f, having values between 0 and 1. A value of exactly 1 means 100% of the molecules are commonly oriented with their planes inclined at a preselected angle theta associated with the orientation of the b-axis and the polymorph type. A value of 0 means that the molecules are randomly oriented. Table I summarizes the values of f found using the intensities of 16 bands for LEO and unit gravity control samples assuming a value of theta =25 degrees. This value of theta is close to the angle that would apply to alpha-CuPc in the standing b-axis configuration, viz. 26.5 degrees. Choice of this angle is somewhat arbitrary but there is a maximum value allowed by the constraint that f cannot be greater than 1. In this case, theta =25 degrees is the maximum value allowed by the large relative peak intensity assymmetry displayed by the RAIR spectra from LEO sample #1 in FIG. 4B. This also is an indication then that the majority of the molecules in the LEO sample #1 are in a polymorph other than the conventional alpha-CuPc or beta-CuPc.

Table I also compares the relative amounts of PVT deposited CuPc in the GB and LEO samples, as obtained from the average band spectral absorbances, by the method discussed also in Debe, supra. LEO and unit gravity grown films are seen to have average thicknesses which agree to within a factor of 1 to 2 depending on whether the GB cells were backfilled or evacuated (GB 5-7). When evacuated, the ampoule walls near the substrate are cooler and less material is deposited on the substrate.

TABLE I

Summary of order parameter and average thickness values for the LEO and ground based (GB) samples

| Sample | Relative Thickness (all values ± 30%) | Order Parameter |
| --- | --- | --- |
| LEO #1 | 1.00 | 1.00 |
| LEO #2 | 0.85 | 0.92 |
| GB #1 | 0.9 | 0.95 |
| GB #2 | 0.5 | 0.53 |
| GB #3 | 0.85 | 0.66 |
| GB #4 | 1.0 | 0.74 |
| GB #5 | 0.5 | 0.53 |
| GB #6 | 0.4 | 0.68 |
| GB #7 | 0.6 | 0.85 |

Figure 5A:
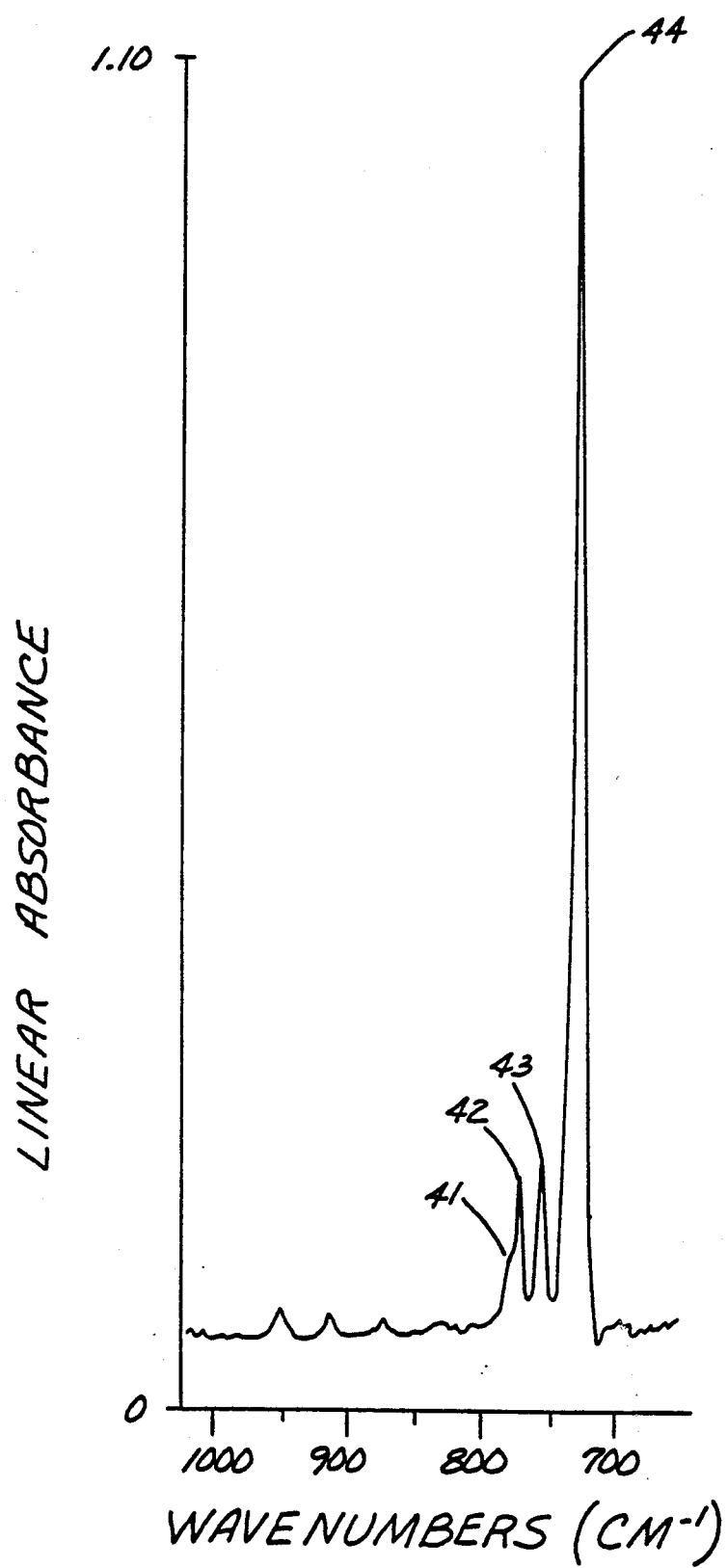
FIG. 5A shows the 1000 to 600 cm$^{-1}$ region of a RAIR spectrum from a low gravity PVT grown layer of CuPc.
Figure 5B:
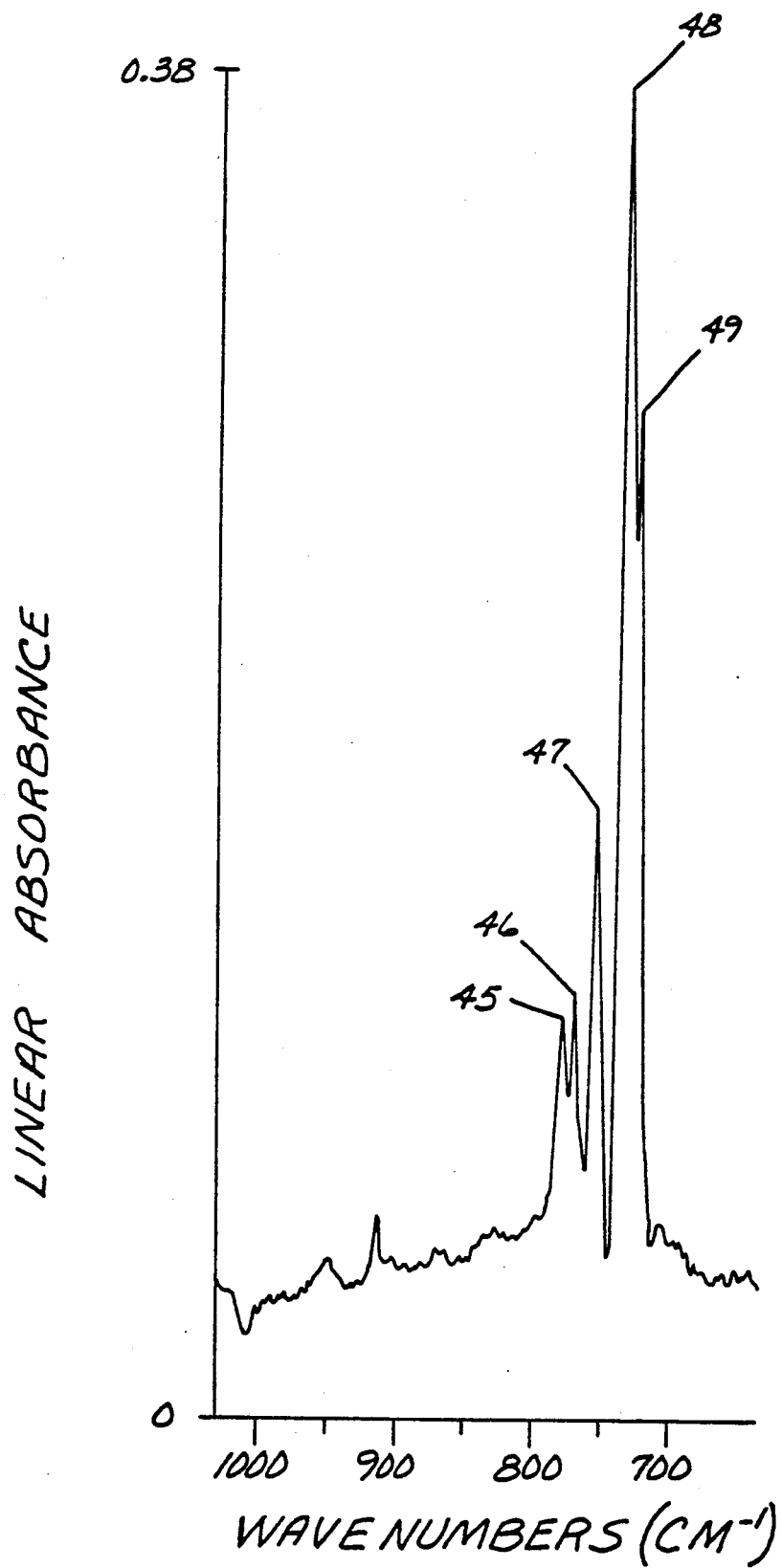
FIG. 5B shows a unit gravity (comparative) PVT grown layer displaying sensitivity to the alpha- and beta-polymorph types.

The second important characteristic of the IR spectra which can reflect on the existence of the new polymorph is band frequency. FIGS. 5A and 5B compare a sensitive region of the RAIR spectra from LEO 2 and GB 5 CuPc film samples as an example. Sensitivity of the out-of-plane vibrational modes to the type of crystalline polymorph is well documented in the literature. In particular, the large band in the 720-730 cm$^{-1}$ range from phthalocyanines can be used to differentiate between alpha and beta forms. In CuPc this band occurs at 722 cm$^{-1}$ for alpha but 730 cm$^{-1}$ for beta-CuPc. In addition, beta CuPc is uniquely associated with a peak at 778 cm$^{-1}$. In FIG. 5B peaks 45, 46, 47, 48 and 49 respectively are observed at 778, 769, 754, 730 and 722 cm$^{-1}$. In FIG. 5B, the GB 5 sample is thus clearly seen to contain both conventional alpha and beta-CuPc material and graphically displays this band position sensitivity to polymorph type.

All the other unit gravity control GB films show this main peak at 720-723 cm$^{-1}$ except GB 1 for which it occurs at 724-725 cm$^{-1}$. Furthermore all the GB samples show either a distinct peak at 778 cm$^{-1}$ or, in the cases of GB 1 and 7, a definite hard shoulder. This is consistent with the X-ray diffraction results which show distinct beta-CuPc crystalline material in the unit gravity films of adequate domain size to give diffraction. That the main peak is consistently closer to the position for conventional alpha-CuPc than for beta-CuPc implies that unit gravity grown films consist primarily of alpha-CuPc, but not in large enough crystalline domains to give significant X-ray diffraction intensity.

In contrast, both the LEO 1 and 2 spectra show, as FIG. 5A indicates, the main peak 44 at 727-728 cm$^{-1}$. This is 5-6 cm$^{-1}$ above that of alpha-CuPc, yet 2-3 cm$^{-1}$ below that of beta-CuPc. Also, the LEO spectra show only a soft shoulder 41 at 778 cm$^{-1}$ like the bulk alpha-CuPc does, i.e., no additional intensity due to beta-CuPc is indicated. In FIG. 5A, peaks 42 and 43 occur at 770 and 753 cm$^{-1}$. The RAIR spectra fully support X-ray diffraction data that the LEO PVT grown films consist of a new polymorph of CuPc which has characteristics between that of the conventional alpha and beta-CuPc. The fact that this new polymorph gives strong, sharp X-ray diffraction peaks implies that the LEO films have larger crystalline domains of this new polymorph than the unit gravity films do of alpha-CuPc.

That the main peak position in GB 1 approaches that of the LEO samples also is consistent with the X-ray diffraction evidence that GB 1 contains some of the new M-CuPc polymorph.

All the LEO and GB IR spectra show evidence of hydrocarbon impurities by virtue of broad baseline shifts between 1600-1750 cm$^{-1}$ due to carbonyl type moieties. Comparing the maximum baseline "peak" intensity in this region with the in-plane band intensities allows roughly estimating the relative amounts of these oxygenated impurities. They were the same and least for LEO 1 and 2 and GB 1, 3 and 4. The other unit gravity control sample's values were about twice as large.

In conclusion, the IR characterization of the LEO and unit gravity grown films shows that:

a) GB sample films consisted primarily of conventional alpha and beta-CuPc, whereas the LEO sample films consisted of a new polymorph, referred to here as M-CuPc. One GB sample, 1, could contain some of the new polymorph.

b) LEO grown films consisted of essentially just the new M-CuPc polymorph, not a mixture of two or more types.

c) LEO films were generally more highly uniaxially oriented than the GB films.

d) The PVT process was primarily responsible for the preferential orienting of CuPc films in a standing b-axis configuration, in contrast to vacuum sublimation deposited films; that is, presence of a seed film did not produce a significantly different result.

e) LEO and GB control films had approximately the same hydrocarbon impurity levels.

f) LEO and GB control films had the same average thicknesses to within a factor of about two.

g) Closed chamber PVT leads in all cases, for either unit gravity or LEO, to alpha or beta or the new M-CuPc polymorphs, in contrast to sublimation into a chamber backfilled to 1–30 Torr, or open chamber PVT, which produced the x-CuPc polymorph in the prior art.

EXAMPLE 3

Figure 6A:
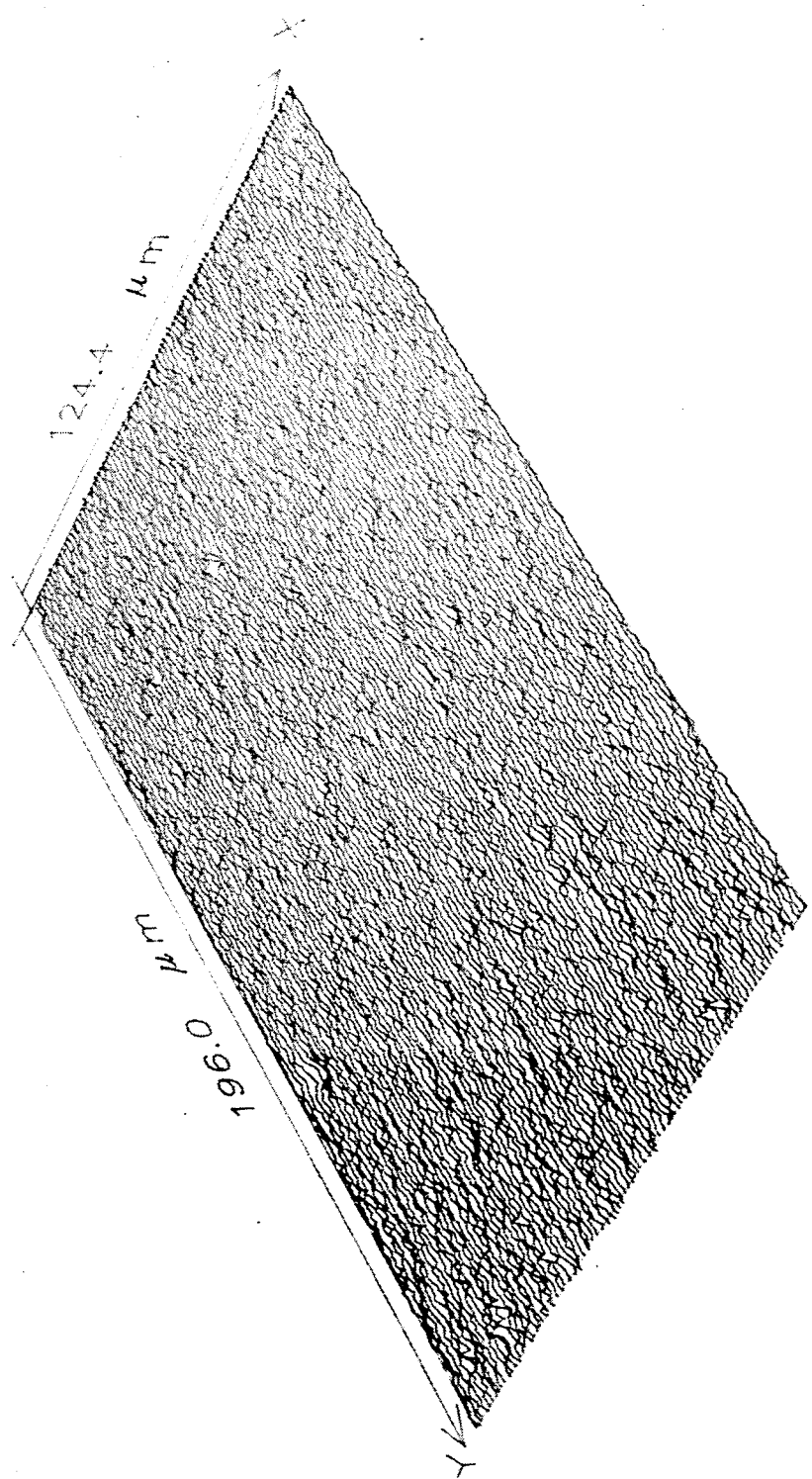
FIG. 6A shows a direct phase contrast interferometric image of the surface roughness of a ground grown PVT layer of CuPc (comparative)
Figure 6B:
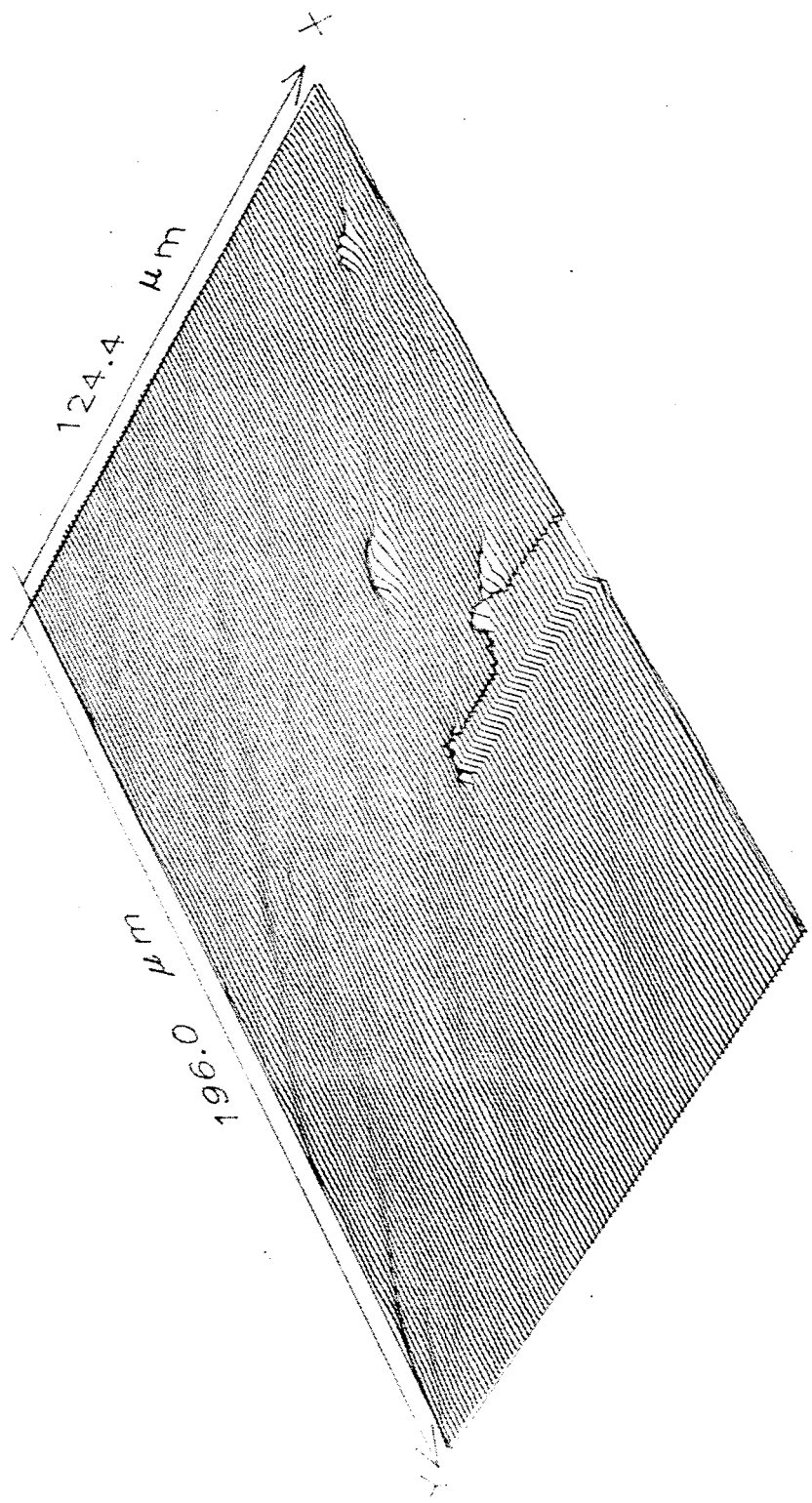
FIG. 6B shows a low gravity grown PVT layer of CuPc.
Figure 6C:
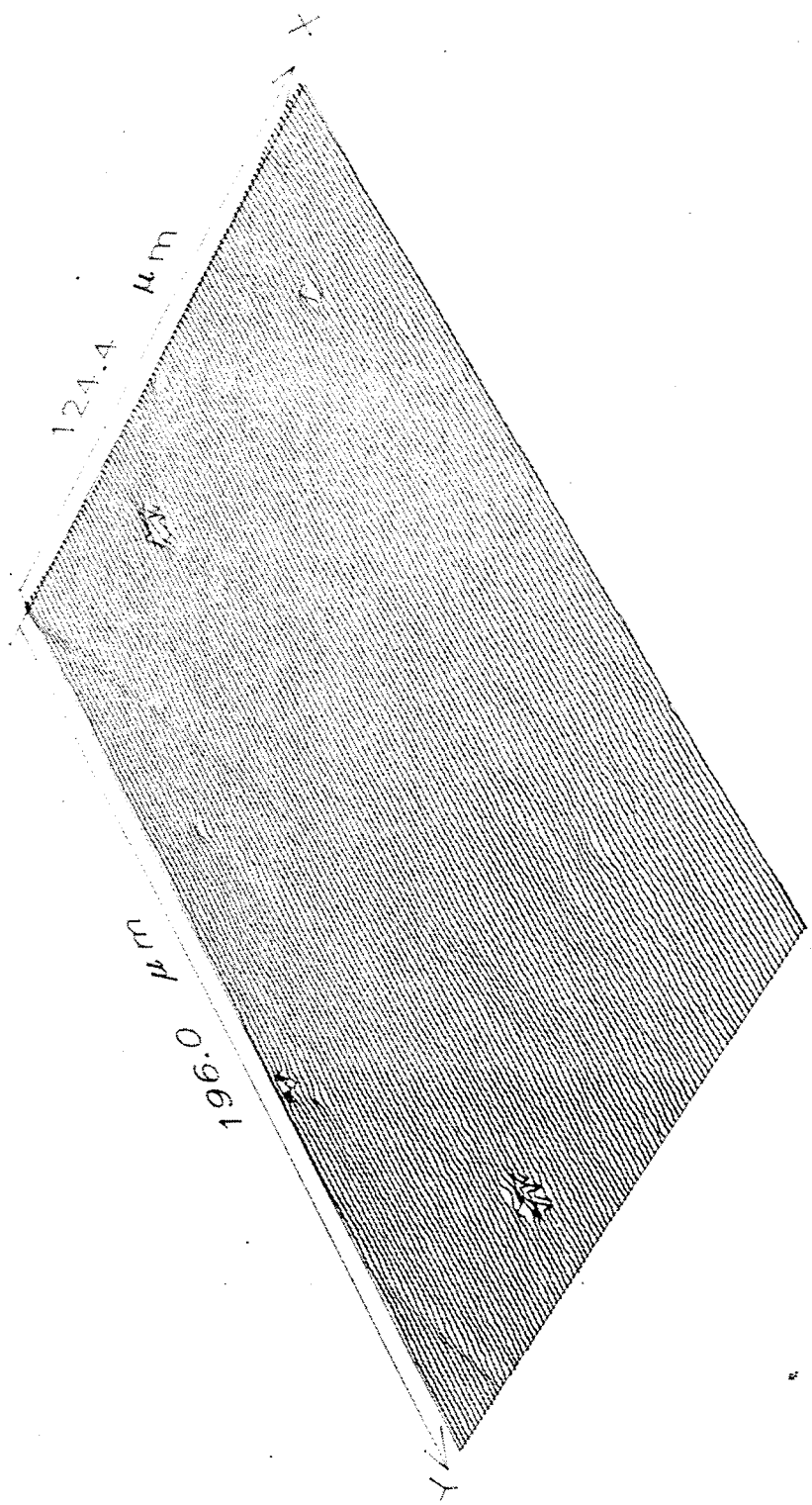
FIG. 6C shows a low gravity grown PVT layer of CuPc.

In this example, surface smoothness at the 1 to 10 micrometer scale of the LEO and GB samples were compared. FIGS. 6A, 6B and 6C show respectively the direct phase contrast interferometric (DPC) graphics images of samples GB 1, LEO 1 and 2. Samples GB 2-4 produced images virtually identical to FIG. 6A. These four GB samples were produced under conditions most closely approximating those of LEO samples except for the absence of convection in the latter samples. From FIGS. 6A–6C and a statistical analysis of the surface profile lines forming the image it can be concluded that:

a) the level of surface roughness was very similar in all four of the GB samples, despite the orientation of the chamber during heating relative to the gravity vector, or whether the substrate contained a seed film.

b) the level of surface roughness was similar for both of the LEO grown samples and, most importantly, definitely less than on any of the GB samples. Surface roughness can be defined as the ratio of the true surface area to the geometric planar area, where the true surface area is measured from the fine integral of the surface profile lines forming the DPC image. Whereas the surface roughness factor for the GB samples was on the order of 1.000100, the roughness factor for the two LEO samples was 1.000007 and 1.000008. (The hill-like features seen on the LEO sample images were due to foreign particles and computing artifacts).

It can be concluded that processing in a low gravity environment such that buoyancy driven convection was minimized improved the smoothness of films deposited by vapor processes.

EXAMPLE 4

In this example it was shown using ellipsometry that minimizing convection by carrying out PVT in a minimal residual gravitational acceleration environment lead to films having more homogeneous optical properties and less roughness at the submillimeter scale.

FIGS. 7A to 7D show plots of the ellipsometric DEL and PSI parameters as functions of position along the diameters of the sample films, from one edge of the sample to the opposite edge. The sample center is at 0.0. In each case circles and squares represent stepping the position of the laser beam along perpendicular diameters. Each data point represents the average of four or six values obtained by repetitively translating back and forth along the same diameter. Root-mean-square (rms) deviation from the average is then used to plot error bars when they exceed the physical size of the symbol used in the plot. Presence and size of the error bars give an indication of film roughness or inhomogeneity on the scale equal or less than the laser beam diameter since small errors in returning repeatedly to the same spot on the sample result in deviations in the ellipsometric parameters if the film is not uniform over the range of the beam position errors.

Larger scale variations of ellipsometric parameters with radial position on the sample directly indicate the "optical thickness" of the deposited film. parameters do not directly indicate true thickness because the complex optical refractive index is intrinsically involved in the films' optical response as well. The way in which the DEL and PSI parameters vary with position on the substrate indicates how the combined effects of physical thickness and optical constants are varying with position. E.g., if there is much scatter in the DEL and PSI data points or error bars then the conclusion is that the film uniformity or homogeneity is poor.

Figure 7A:
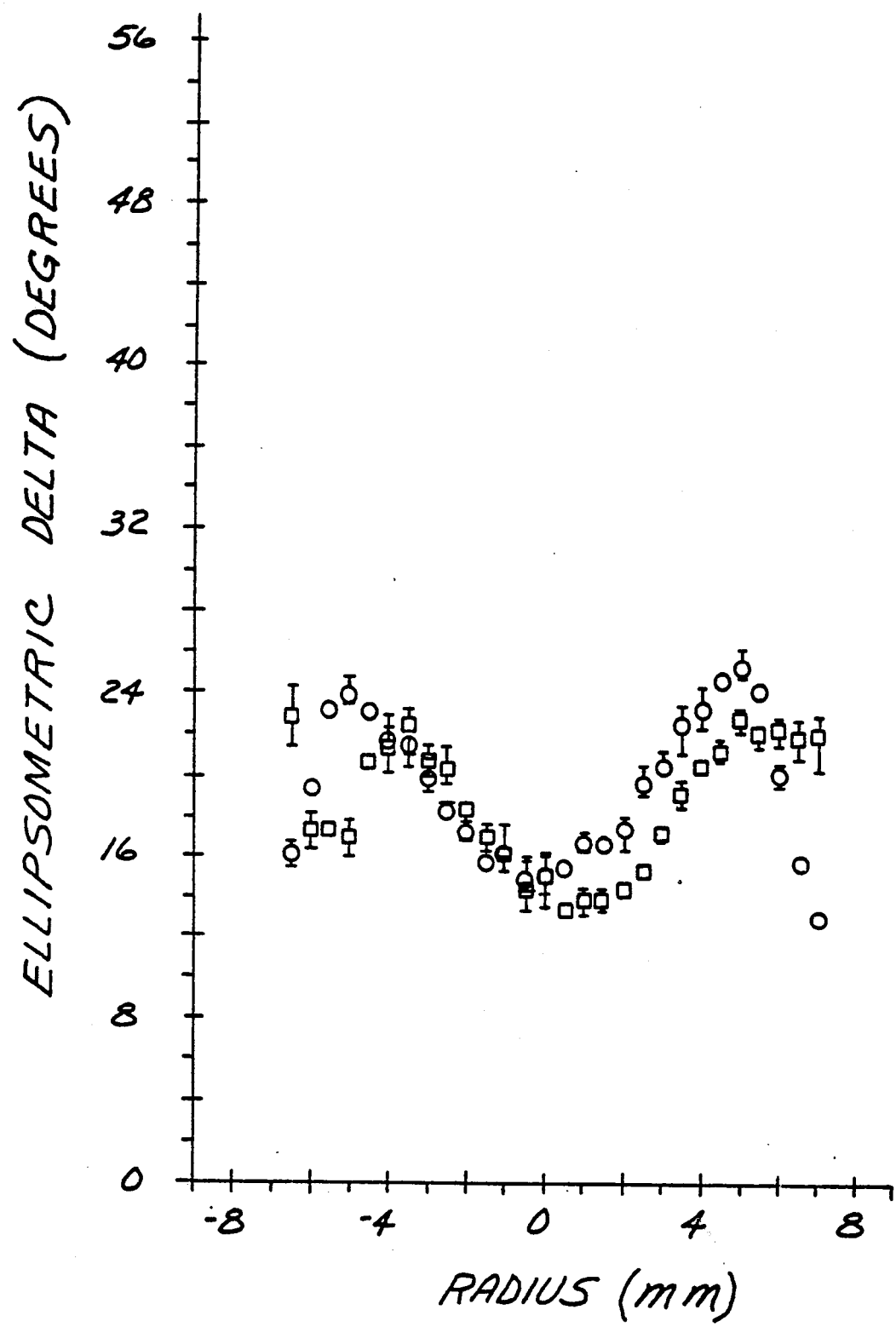
FIGS. 7A and 7B show curves of ellipsometric PSI and DEL parameters versus radial position (comparative), of a typical ground grown PVT layer of CuPc.
Figure 7B:
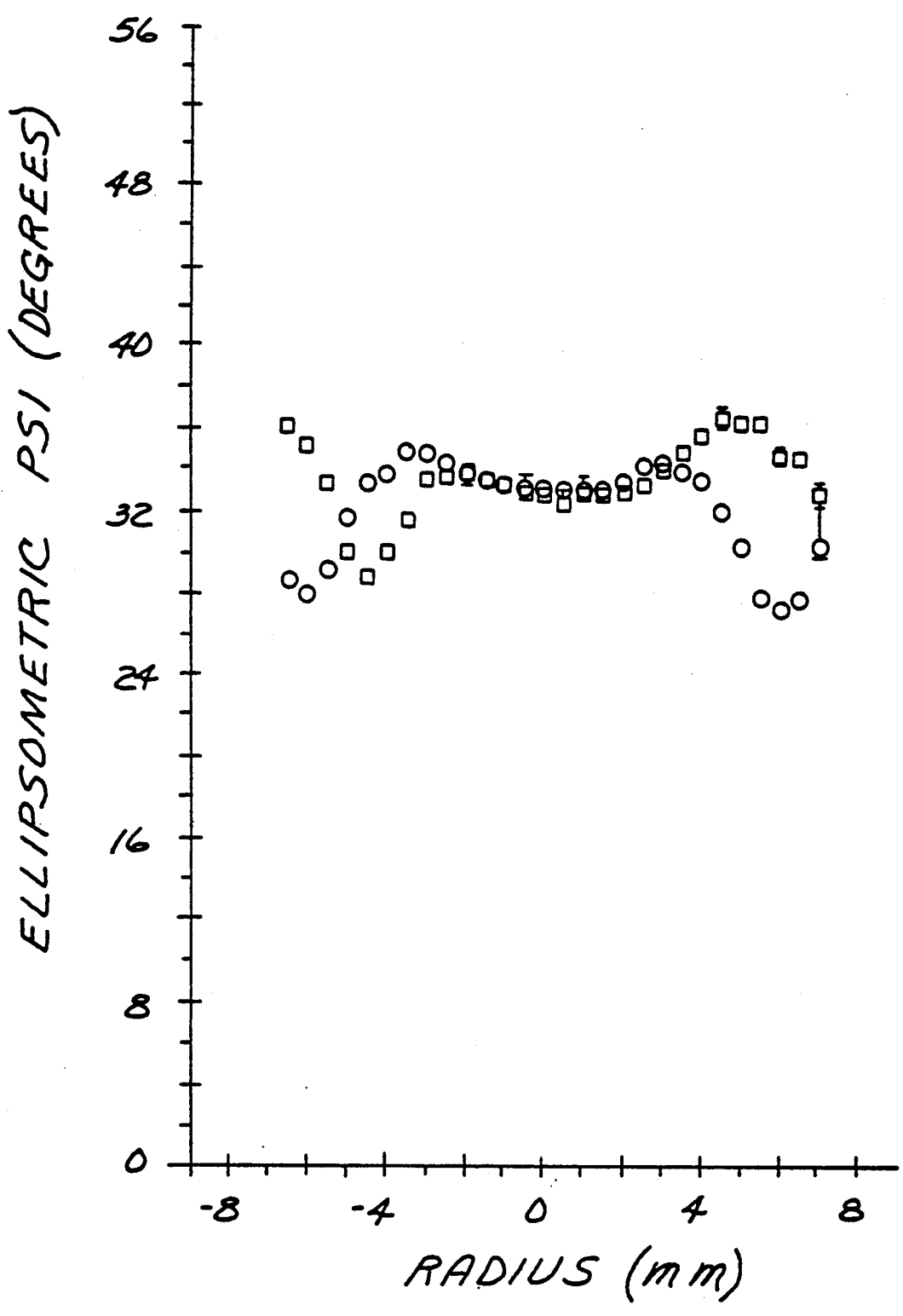
Figure 7C:
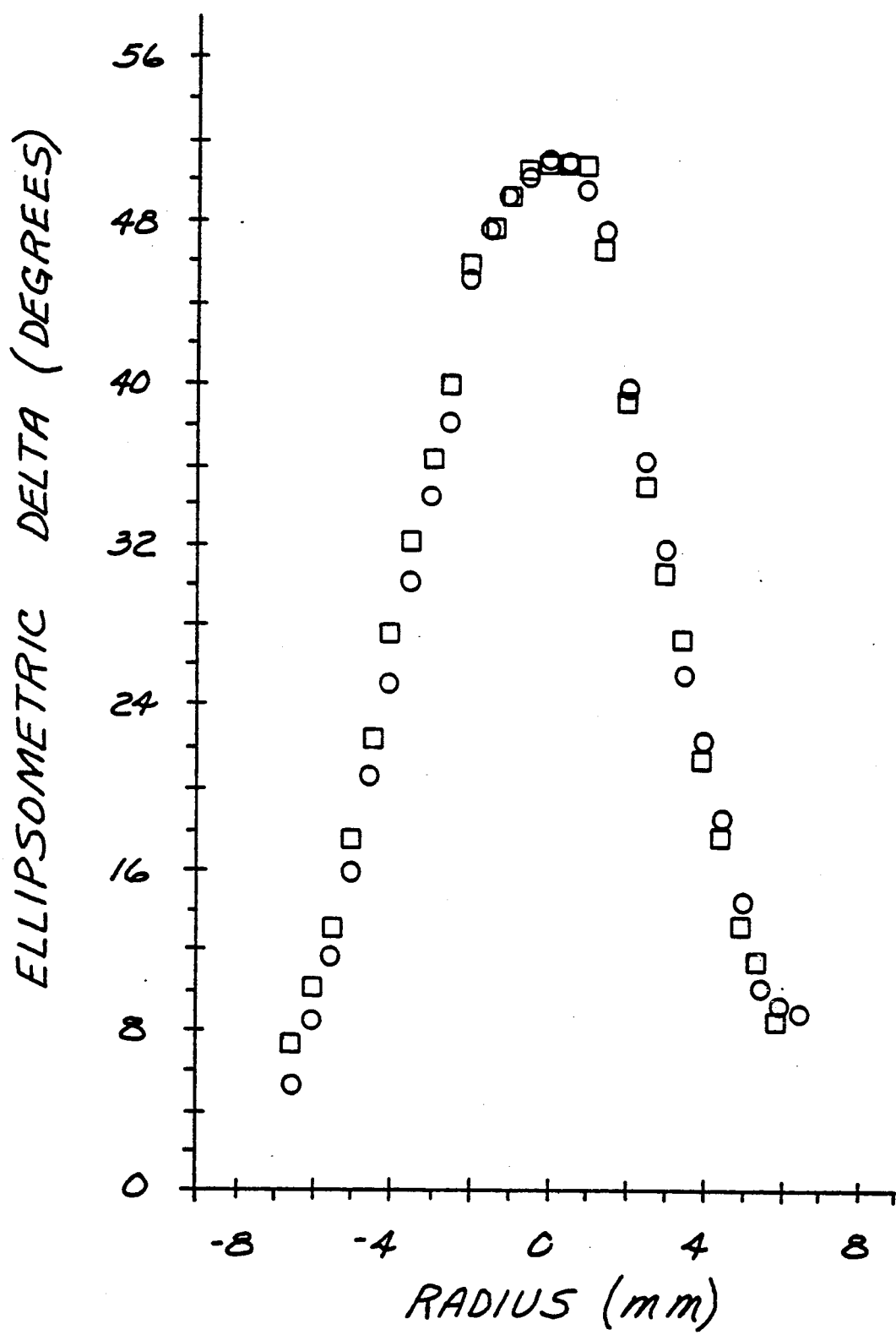
FIGS. 7C and 7D show ellipsometric PSI and DEL parameters versus radial position for a low gravity grown PVT CuPc layer. Both samples contain a metal-free phthalocyanine seed (first) layer.
Figure 7D:
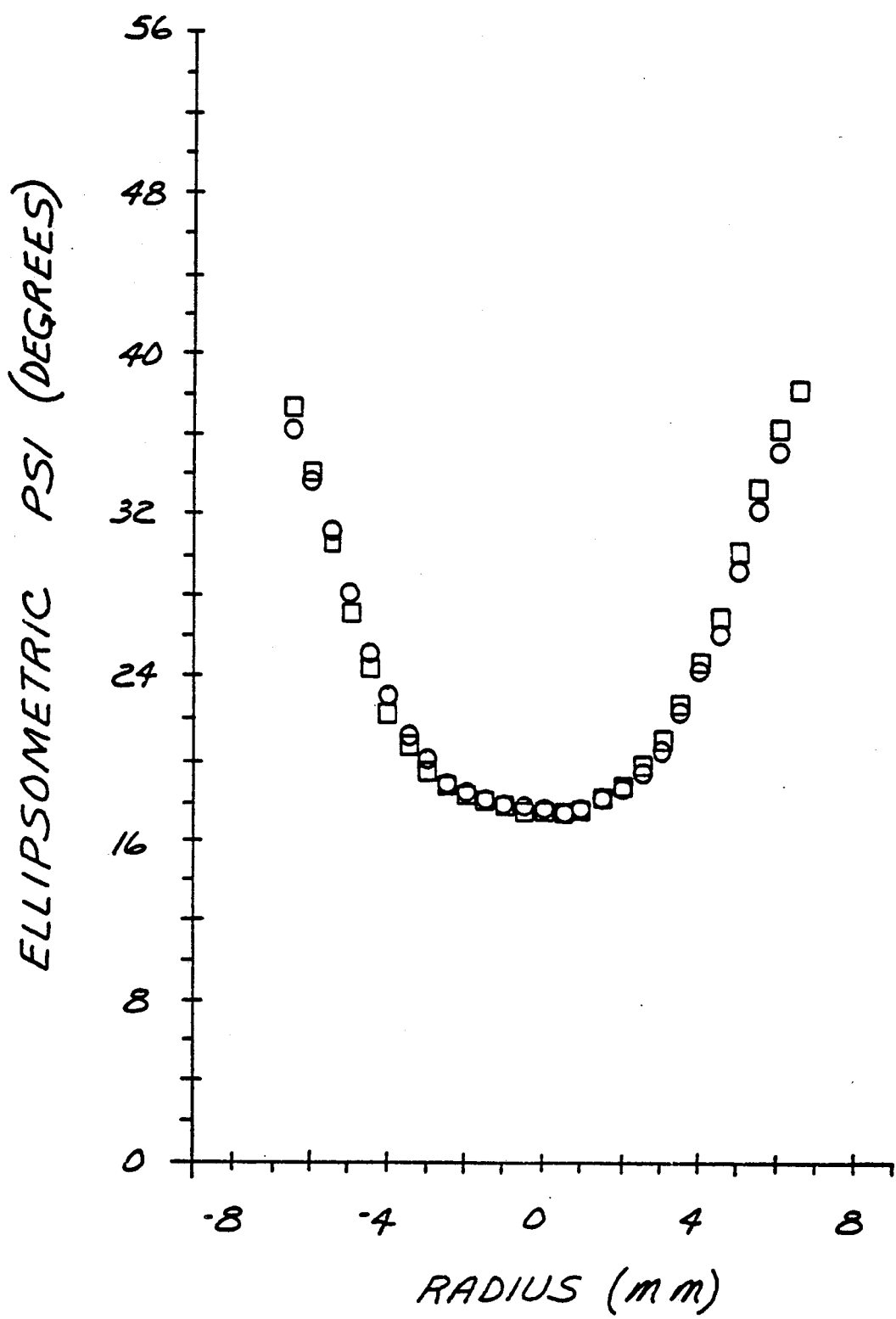

FIGS. 7A and 7B show DEL and PSI plots for a typical to better than average GB sample. There is clearly significant scattering between the curves of square and circle symbols in all the GB plots. There are also sizeable error bars on some of the curves. Most important, there is no clear trend or shape of the curves which is common to all the GB samples. In contrast, FIGS. 7C and 7D show the corresponding plots from LEO 1 sample. Here the square and circle plotted curves overlap extremely well, with no error bars larger than the symbol sizes. A very distinct radially symmetric paraboloid or inverted paraboloid like shape is common to both LEO samples. This shape is believed to represent an optical property sensitive parameter such as the film density which makes the refractive index of the film vary in such a radially dependent manner. This is shown to be the most likely explanation in EXAMPLE 7 below.

In conclusion, spatially resolved ellipsometric data show that minimization of convection by processing in a low gravity environment has qualitatively a) enhanced the film smoothness in the submillimeter size range, b) enhanced the homogeneity of the radial distribution of the deposited film material on the substrate, and c) improved the radial symmetry of the film optical properties.

EXAMPLE 5

Visible absorption spectra from several of the double layered LEO and GB film samples also provided supporting evidence of the existence of a new polymorph. Reflectance absorption spectra covering the wavelength range of 200 to 850 nm were obtained near an incidence angle of 68 degrees. LEO 1 sample was unique in showing a weak peak absorption at 800 nm, while the GB samples' absorption spectra decreased monotonically above about 730 nm. Such shifting of the absorption towards the near IR is typical of different crystalline polymorphic behavior in phthalocyanine materials. In particular, Horn et al., Proc XIIth FATIPEC Congress (1974) Verlag Chemie, Weinheim, 1974, pp. 181-189 discuss this for CuPc.

EXAMPLE 6

Visual inspection of sample films also supported the conclusions resulting from spatially sensitive ellipsometry. To the unaided eye, looking at the LEO and GB films on their substrates with reflected diffuse white light revealed a distinctly different appearance of the LEO films. They appeared to be optically clearer and smoothly varying in their optical reflectivity from center to edge. They appeared to be darker in hue than the GB films when viewed at normal incidence, yet off normal incidence they displayed an unusual uniformly increasing brightness in their center as the incidence angle increased. This brightening effect was polarization sensitive. This was a consequence of the films' optical clarity and refractive index differences between the first layer $H_2Pc$ and overcoated CuPc. In contrast, many of the GB samples appeared to have distinct interference thickness rings.

EXAMPLE 7

Figure 8A:
FIGS. 8A and 8B show scanning electron microscope photographs of a PVT grown CuPc film grown in the laboratory under unit gravity conditions. Both were taken with a magnification of 30,000×; A shows a view at 45 degrees to the fractured edge, and B shows a plan view of the film surface.
Figure 8B:
Figure 9A:
FIGS. 9A and 9B show scanning electron microscope photographs of a PVT grown CuPc film grown in the microgravity environment. Both were taken with a magnification of 30,000×; A shows a view at 45 degrees to the fractured edge, and B shows a plan view of the film surface.
Figure 9B:
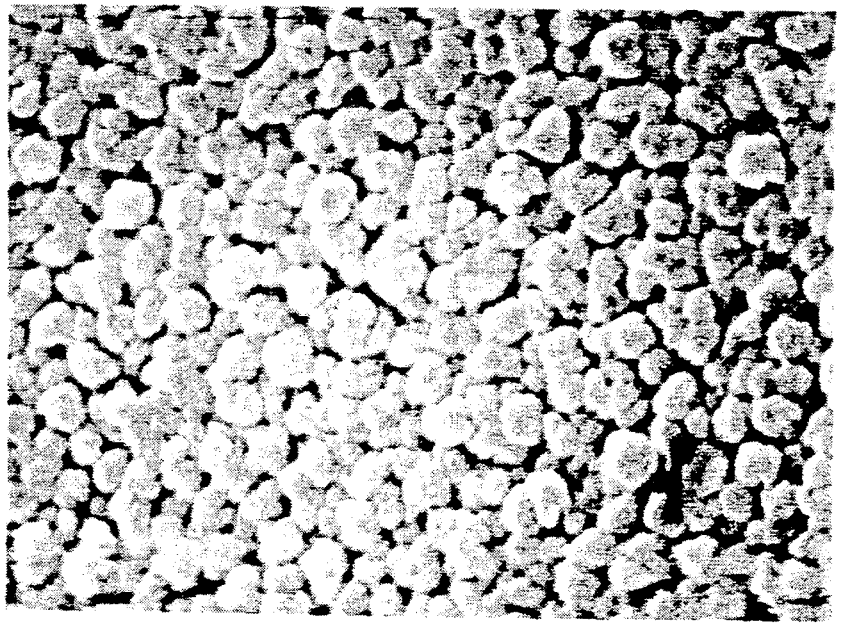

In this example, scanning electron microscopy (SEM) was used to graphically show that the density of microgravity grown films was substantially higher at their centers than these of corresponding ground control films. FIGS. 8 (a, b) and 9 (a, b) compare the SEM images of the centers of a ground control film and a microgravity film (GB 1 and LEO 1 as prepared in EXAMPLE 1) at 30,000× magnification, from both a plan view perspective and a 45 degree edge view of the fractured edge. The LEO 1 film shows very densely packed CuPc material in what appear to be substantially vertically oriented, contacting nodular crystalline domains. In contrast, the GB 1 film shows a very open arrangement of discrete, vertically oriented whisker-like crystallites, which visually can be estimated to occupy at least twice the area per crystallite domain as in the LEO 1 sample, implying the LEO sample was at least twice as dense as the GB sample. The shape and form of the crystalline domains appear very different between the LEO and GB samples, in agreement with the X-ray diffraction data discussed in EXAMPLE 1. Film surface of the LEO sample was also obviously smoother over the 0.1 to 1.0 micron size range than that of the GB film, supporting the evidence presented in EXAMPLE 3 and extending the range of enhanced smoothness another decade.

Although not shown, the SEM micrographs taken of the edges of the LEO and GB samples looked very similar to each other and to the image of GB 1 shown in FIG. 8. Near the edges of the sample diameters, where strong thermal gradients prevailed across the approximately one millimeter gap between the hot inside edge of the ampoule and the cooled copper substrate, convective disturbances were to be expected even in the low gravity environment. This also is evidence then that the elimination of convective disturbances over the center portions of the films by carrying out the PVT in a low gravity environment endowed the films with the enhanced properties described in this and the previous examples. This radial variation of the LEO films' density and microstructure morphology also explains the enhanced optical homogeneity manifested by the ellipsometric DEL and PSI curves of EXAMPLE 4. It furthermore proves that the dramatic difference in microstructure between the LEO and GB samples illustrated in FIGS. 8 (a, b) and 9 (a, b) is not a consequence of differing substrate temperatures, buffer gas compositions, source material purity, substrate seed film orientation, or any other likely PVT parameter, since this dramatic difference was in the same sample if convection was minimized as in a low gravity environment. This was an important self consistency check on the examples of this invention.

Various modifications and alterations of this invention will become apparent to those skilled in the art without departing from the scope and spirit of this invention, and it should be understood that this invention is not to be unduly limited to the illustrative embodiments set forth herein.

I claim:

1. A process for depositing a layer of organic molecules on a substrate comprising the steps of:
   a) providing an evacuable, sealable chamber comprising two ends, the chamber having a means for vacuum outgassing said chamber, means for introducing a buffer gas, a means for providing a temperature gradient between the two ends of the chamber so as to provide a hotter first end and a cooler second end, said chamber further comprising sublimable organic source molecules secured near said first end and a substrate secured near said second end which substrate is coated on at least a portion of at least one surface thereof with a layer of uniaxially oriented inorganic or organic molecules, and outgassing said chamber to a pressure in the range of $10^{-6}$ to $10^{-10}$ Torr;
   b) introducing a buffer gas into said chamber at a pressure in the range of 0.001 to 10,000 Torr and sealing said chamber,
   c) subjecting said chamber to a low gravity environment of at most 0.1 G,
   d) applying heat to said chamber such that the first end is at a temperature which is sufficient to sublime said source molecules, while cooling said second end to a temperature in the range of 0.25 to 0.99 of said first end temperatures in degrees Kelvin, said application of heat at said first end continuing for a time sufficient to deposit said source molecules as a layer of the desired thickness onto said substrate or coated substrate to provide a layered structure having coated thereon a layer comprising at least 90 weight percent of a single polymorphic form of said source molecules, wherein said deposited organic layer has a surface roughness factor in a range greater than 1.000000 and less than 1.000010; and
   wherein said deposited organic layer has a density at least 50 percent greater than any polymorph of the same molecules produced in unit gravity, and
   wherein at least 50 percent of the molecules of said deposited organic layer have a common uniaxial orientation.

2. The process according to claim 1 wherein said substrate is coated on at least a portion of at least one surface thereof with a layer of uniaxially oriented organic seed material to provide a layered structure wherein said source material is epitaxial with said seed layer.

3. The process according to claim 1 wherein said source material is a phthalocyanine.

4. The process according to claim 1 wherein said source material is a metal phthalocyanine.

5. The process according to claim 1 wherein said source material is copper phthalocyanine.

6. The process according to claim 5 wherein said layer of copper phthalocyanine in said layered structure has a polymorphic form exhibiting six distinct X-ray diffraction peaks corresponding to lattice spacings in the range of 0.32 to 0.38±0.001 nm and an infrared absorption peak at 727 to 728 wave numbers ($cm^{-1}$) and the absence of a peak at 778 wave numbers. all wave numbers having an uncertainty of at most ±1 $cm^{-1}$.

7. A process for depositing a layer of organic molecules on a substrate comprising the steps of:
   a) providing an evacuable, sealable chamber comprising two ends, the chamber having a means for vacuum outgassing said chamber, means for introducing a buffer gas, a means for providing a temperature gradient between the two ends of the chamber so as to provide a hotter first end and a cooler second end, said chamber further comprising sublimable organic source molecules secured near said first end and a substrate secured near said second end which substrate is coated on at last a portion of at least one surface thereof with a layer of uniaxially oriented inorganic or organic molecules, and outgassing said chamber to a pressure in the range of $10^{-6}$ to $10^{-10}$ Torr;
   b) introducing a buffer gas into said chamber at a pressure in the range of 0.001 to 10,000 Torr and sealing said chamber,
   c) maintaining said chamber substantially free of buoyancy driven convection,
   d) applying heat to said chamber such that the first end is at a temperature which is sufficient to sublime said source molecules, while cooling said second end to a temperature in the range of 0.25 to 0.99 of said first end temperatures in degrees Kelvin, said application of heat at said first end continuing for a time sufficient to deposit said source molecules as a layer of the desired thickness onto said substrate or coated substrate to provide a layered structure having coated thereon a layer comprising at least 90 weight percent of a single polymorphic form of said source molecules, wherein said deposited organic layer has a surface roughness factor in a range greater than 1.00000 and less than 1.000010; and wherein said deposited organic layer has a density at least 50 percent greater than any polymorph of the same molecules produced in unit gravity, and wherein at least 50 percent of the molecules of said deposited organic layer have a common uniaxial orientation.

8. A process for depositing a layer of organic molecules on a substrate comprising the steps of:
   a) providing an evacuable, sealable chamber comprising two ends, the chamber having a means for vacuum outgassing said chamber, means for introducing a buffer gas, a means for providing a temperature gradient between the two ends of the chamber so as to provide a hotter first end and a cooler second end, said chamber further comprising sublimable organic source molecules secured near said first end and a substrate secured near said second end, and outgassing said chamber to a pressure in the range of $10^{-6}$ to $10^{-10}$ Torr;
   b) introducing a buffer gas into said chamber at a pressure in the range of 0.001 to 10.000 Torr and sealing said chamber,
   c) subjecting said chamber to a low gravity environment of at most 0.1 G,
   d) applying heat to said chamber such that the first end is at a temperature which is sufficient to sublime said source molecules, while cooling said second end to a temperature in the range of 0.25 to 0.99 of said first end temperatures in degrees Kelvin, said application of heat at said first end continuing for a time sufficient to deposit said source molecules as a layer of the desired thickness onto said substrate or coated substrate to provide a layered structure having coated thereon a layer comprising at least 90 weight percent of a single polymorphic form of said source molecules, wherein said deposited organic layer has a surface roughness factor in a range greater than 1.000000 and less than 1.000010; and wherein said deposited organic layer has a density at least 50 percent greater than any polymorph of the same molecules produced in unit gravity.

* * * * *